(12) United States Patent
Mellow et al.

(10) Patent No.: US 8,831,248 B2
(45) Date of Patent: Sep. 9, 2014

(54) APPARATUS WITH DIRECTIVITY PATTERN

(75) Inventors: Timothy J. Mellow, Farnham (GB); Leo M. J. Karkkainen, Helsinki (FI)

(73) Assignee: Nokia Corporation, Espoo (FI)

( * ) Notice: Subject to any disclaimer, the term of this patent is extended or adjusted under 35 U.S.C. 154(b) by 346 days.

(21) Appl. No.: 13/197,938

(22) Filed: Aug. 4, 2011

(65) Prior Publication Data
US 2012/0033834 A1     Feb. 9, 2012

Related U.S. Application Data

(60) Provisional application No. 61/400,920, filed on Aug. 4, 2010.

(51) Int. Cl.
| | | |
|---|---|---|
| *H04R 3/00* | (2006.01) | |
| *H04R 5/02* | (2006.01) | |
| *H04R 25/00* | (2006.01) | |
| *H04R 1/00* | (2006.01) | |
| *H04R 9/06* | (2006.01) | |

(52) U.S. Cl.
USPC ........... 381/116; 381/300; 381/190; 381/191; 381/186; 381/424

(58) Field of Classification Search
USPC ......... 381/190, 191, 396, 120, 184, 186, 423, 381/424, 111, 116
See application file for complete search history.

(56) References Cited

U.S. PATENT DOCUMENTS

| | | | | |
|---|---|---|---|---|
| 1,983,377 | A * | 12/1934 | Kellogg | 381/191 |
| 2,437,282 | A * | 3/1948 | Turner, Jr. | 367/168 |
| 3,008,013 | A * | 11/1961 | Walker et al. | 381/182 |
| 3,372,245 | A * | 3/1968 | Yoshida et al. | 381/96 |
| 3,773,984 | A * | 11/1973 | Walker | 381/96 |
| 3,892,927 | A * | 7/1975 | Lindenberg | 381/116 |
| 4,311,874 | A * | 1/1982 | Wallace, Jr. | 381/87 |
| 4,357,498 | A * | 11/1982 | Tsuchiya et al. | 381/186 |
| 5,471,540 | A * | 11/1995 | Maeda | 381/191 |
| 6,427,017 | B1 | 7/2002 | Toki | |
| 6,449,376 | B1 * | 9/2002 | Beltran et al. | 381/423 |
| 6,920,230 | B2 * | 7/2005 | Usuki et al. | 381/396 |
| 7,095,863 | B2 * | 8/2006 | Heron et al. | 381/152 |
| 7,319,641 | B2 * | 1/2008 | Goudie et al. | 367/138 |

(Continued)

FOREIGN PATENT DOCUMENTS

| | | |
|---|---|---|
| EP | 1 617 703 A2 | 1/2006 |
| EP | 1 827 057 A2 | 12/2006 |

(Continued)

OTHER PUBLICATIONS

Maxim, "2 × 1.5W, Stereo Class D Audio Subsystem with DirectDrive Headphone Amplifier", Aug. 2008, Rev 4, Maxim Integrated Products, pp. 1-38.*

(Continued)

*Primary Examiner* — Davetta W Goins
*Assistant Examiner* — Daniel Sellers
(74) *Attorney, Agent, or Firm* — Harrington & Smith

(57) ABSTRACT

A loudspeaker is described. The loudspeaker includes two or more segmentations of a planar radiator. Each of the segmentations has an associated frequency dependent velocity magnitude and phase with substantially uniform surface pressure. The two or more segmentations provide a substantially uniform radiation pattern across a wide range of acoustic frequencies. Apparatus, computer readable media and methods are also described.

19 Claims, 18 Drawing Sheets

(56) References Cited

U.S. PATENT DOCUMENTS

| | | | |
|---|---|---|---|
| 7,372,110 B2 | 5/2008 | Hatano | 257/379 |
| 8,345,898 B2 * | 1/2013 | Reining | 381/184 |
| 8,385,586 B2 * | 2/2013 | Liou et al. | 381/431 |
| 2003/0002697 A1 | 1/2003 | Mellow | 381/190 |
| 2004/0240697 A1 * | 12/2004 | Keele, Jr. | 381/336 |
| 2005/0226455 A1 | 10/2005 | Aubauer et al. | 381/388 |
| 2006/0012559 A1 | 1/2006 | Kang | 345/108 |
| 2008/0085019 A1 | 4/2008 | Wagenaars | 381/152 |

FOREIGN PATENT DOCUMENTS

| | | |
|---|---|---|
| EP | 1 912 469 A1 | 4/2008 |
| GB | 2 360 901 A | 3/2000 |
| JP | 2-76400 A | 3/1990 |
| JP | 2007-300578 A | 11/2007 |
| WO | WO-2006/038176 A1 | 4/2006 |
| WO | WO-2009/017278 A1 | 2/2009 |

OTHER PUBLICATIONS

"On the forces in single-ended and push-pull electret transducers", Tim Mellow, et al., J. Acoust. Soc. Am. 124(3), Sep. 2008, pp. 1497-1504.

"On the sound field of a circular membrane in free space and an infinite baffle", Tim Mellow et al., J. Acoust. Soc. Am. 120(5), Nov. 2006, pp. 2460-2477.

"Self-Assembled Inorganic Micro-Display on Plastic", Ehsan Saeedi et al., IEEE, Jan. 2007, pp. 755-758.

"Casio, 2.5" LCD with integrated speaker, TechJapan, Sep. 2005, http://www.techjapan.com/PrintArticle1132.html; 2 pgs.

P.J. Walker, "New Developments in Electrostatic Loudspeakers," J. Audio Eng. Soc. 28(11), 795-799 (1980).

M. Aarts and A. J. Janssen, "Sound radiation quantities arising from a resilient circular radiator," J. Acoust. Soc. Am. 121(2), 759-765 (2006).

F. Zernike, "Beaugungstheorie (Diffraction theory of the knife-edge test and its improved form, the phase-contrast method)," Physica, 1, 689-704 (1934).

C. J. Bouwkamp, "Theoretical and numerical treatment of diffraction through a circular aperture," IEEE Transactions of Antennas and Propagation API 8-2, 152-176 (1970).

H. Streng, "Calculation of the surface pressure on a vibrating circular stretched membrane in free space," J. Acoust. Soc. Am. 82(2), 679-686 (1987).

T. J. Mellow, and L.M. Karkkainen, "On the sound field of an oscillating disk in an open and closed circular baffle," J. Acoust. Soc. Am. 118(3), 1311-1325 (2005).

T.J. Mellow, "On the sound field of a resilient disk in free space," J. Acoust. Soc. Am. 123(4), 1880-1891 (2008).

Berger, Michael "Nanotechnology that will rock you" Nanowerk LLC, Nov. 3, 2008.

* cited by examiner

APPARATUS WITH DIRECTIVITY PATTERN

CROSS-REFERENCE TO RELATED APPLICATIONS

This patent application claims priority under 35 U.S.C. §119(e) from U.S. Provisional Patent Application No. 61/400,920, filed Aug. 4, 2010, the disclosure of which is incorporated by reference herein in its entirety.

TECHNICAL FIELD

The exemplary and non-limiting embodiments of this invention relate generally to acoustic transducers and, more specifically, relate to loudspeakers, including dipole and other types of loudspeakers.

BACKGROUND

This section is intended to provide a background or context to the invention that is recited in the claims. The description herein may include concepts that could be pursued, but are not necessarily ones that have been previously conceived, implemented or described. Therefore, unless otherwise indicated herein, what is described in this section is not prior art to the description and claims in this application and is not admitted to be prior art by inclusion in this section.

The trend in portable devices is towards providing larger displays for viewing content without straining the viewer's eyes. It is anticipated that there will be a demand for ultra-thin loudspeakers with a large footprint to deliver high quality sound. These could be electrostatic or electret types that slide out of a lid from behind the display or that fold. In use cases such as teleconferencing, or when several people listen to the same music, it is desirable to have a wide dispersion angle. A dipole or figure-of-eight directivity pattern (also known as polar response) is ideal because it provides a fairly wide angle of dispersion but also has a dead axis which provides a degree of privacy in public spaces.

As the size of a loudspeaker is increased certain factors such as the maximum loudness and bass extension are generally increased, but the increased radiating area results in narrow beam-forming at higher frequencies. This is the primary reason why high fidelity loudspeakers use multiple drive units, with each drive unit devoted to a separate frequency range. However, the use of multiple drive units complicates the design of the loudspeaker, and the multiple drive units are difficult to integrate into a small form factor.

Electrostatic loudspeakers have conventionally used a single diaphragm with electrodes partitioned into multiple concentric rings, where an attenuated and delayed signal is progressively applied to the electrodes starting from the center and working towards the outer electrodes. Reference in this regard can be made, for example, to P. J. Walker, "New Developments in Electrostatic Loudspeakers," J Audio Eng. Soc. 28(11), 795-799 (1980). However, the attenuation reduces efficiency and the resulting directivity pattern is still too narrow at high frequencies.

It is known that with an infinitely large diaphragm it is possible to reproduce the sound field of an omni-directional point source behind it, so long as every part of the diaphragm moves with the same velocity magnitude and phase as the original sound in the plane of the diaphragm. Because the loudspeaker diaphragm is finite, the conventional wisdom is that the motion towards the outer edges of the diaphragm should be attenuated in order to avoid edge diffraction effects that would otherwise produce ripples in the on-axis response and directivity pattern.

SUMMARY

The below summary section is intended to be merely exemplary and non-limiting.

The foregoing and other problems are overcome, and other advantages are realized, by the use of the exemplary embodiments of this invention.

In a first aspect thereof an exemplary embodiment of this invention provides a dipole loudspeaker that comprises an axially symmetric segmentation of a planar radiator, where each axially symmetric segmentation has an associated frequency dependent velocity magnitude and phase but with substantially uniform surface pressure in order to provide a substantially uniform radiation pattern across a wide range of acoustic frequencies.

In another aspect thereof an exemplary embodiment of this invention provides a loudspeaker that comprises an axially symmetric segmentation of a planar radiator, where each axially symmetric segmentation has an associated frequency dependent velocity magnitude and phase but with substantially uniform surface pressure in order to provide a substantially uniform radiation pattern across a wide range of acoustic frequencies, where the axially symmetric segmentation is comprised of a plurality of concentric rings of electrode pairs having a membrane disposed between members of each electrode pair, where there is at least one amplifier for driving each member of an electrode pair, and where there are a plurality of phase delay elements such that an electric signal applied to each the electrode pairs is successively delayed from the centermost electrode pair towards an electrode pair disposed at a periphery of the concentric rings of electrode pairs.

In a further aspect thereof an exemplary embodiment of this invention provides a method that comprises providing a loudspeaker having an axially symmetric segmentation of a planar radiator, where each axially symmetric segmentation is capable of exhibiting an associated frequency dependent velocity magnitude and phase but with substantially uniform surface pressure in order to provide a substantially uniform radiation pattern across a wide range of acoustic frequencies, where the axially symmetric segmentation is comprised of a plurality of concentric rings of electrode pairs having a membrane disposed between members of each electrode pair; and the method further comprising exciting each member of an electrode pair with an electric signal that is applied to each the electrode pairs, where exciting comprises successively delaying the electric signal from a centermost electrode pair towards an electrode pair disposed at a periphery of the concentric rings of electrode pairs.

In another aspect thereof an exemplary embodiment of this invention provides a computer readable medium tangibly encoded with a computer program executable by a processor to perform actions comprising, for a loudspeaker having an axially symmetric segmentation of a planar radiator, where each axially symmetric segmentation is capable of exhibiting an associated frequency dependent velocity magnitude and phase but with substantially uniform surface pressure in order to provide a substantially uniform radiation pattern across a wide range of acoustic frequencies, where the axially symmetric segmentation is comprised of a plurality of concentric rings of electrode pairs having a membrane disposed between members of each electrode pair, exciting each member of an electrode pair with an electric signal that is applied to each the electrode pairs, where exciting comprises successively delaying the electric signal from a centermost electrode pair towards an electrode pair disposed at a periphery of the concentric rings of electrode pairs.

BRIEF DESCRIPTION OF THE DRAWINGS

The foregoing and other aspects of exemplary embodiments of this invention are made more evident in the following Detailed Description, when read in conjunction with the attached Drawing Figures, wherein.

DETAILED DESCRIPTION

In accordance with the exemplary embodiments of this invention, instead of following the conventional approach of attenuating the motion of the loudspeaker diaphragm towards the outer edges, a goal of various exemplary embodiments is to maintain uniform pressure over the entire surface. This approach beneficially increases the velocity amplitude towards the rim, contrary to the conventional wisdom.

In addition, a phase delay is applied that increases progressively towards the outer edges. The delay has the same path length as the normal distance between each point on the diaphragm and the corresponding point on an imaginary sphere behind the diaphragm, assuming that the sphere touches the diaphragm at the center of the diaphragm. This approach produces an ideal dipole directivity pattern that is almost constant at all frequencies, and the on-axis response is very smooth and exhibits only very small ripples.

In addition, the use of the exemplary embodiments is not restricted to circular ring geometries, as elliptical or rectangular shapes benefit as well.

Figure 1:
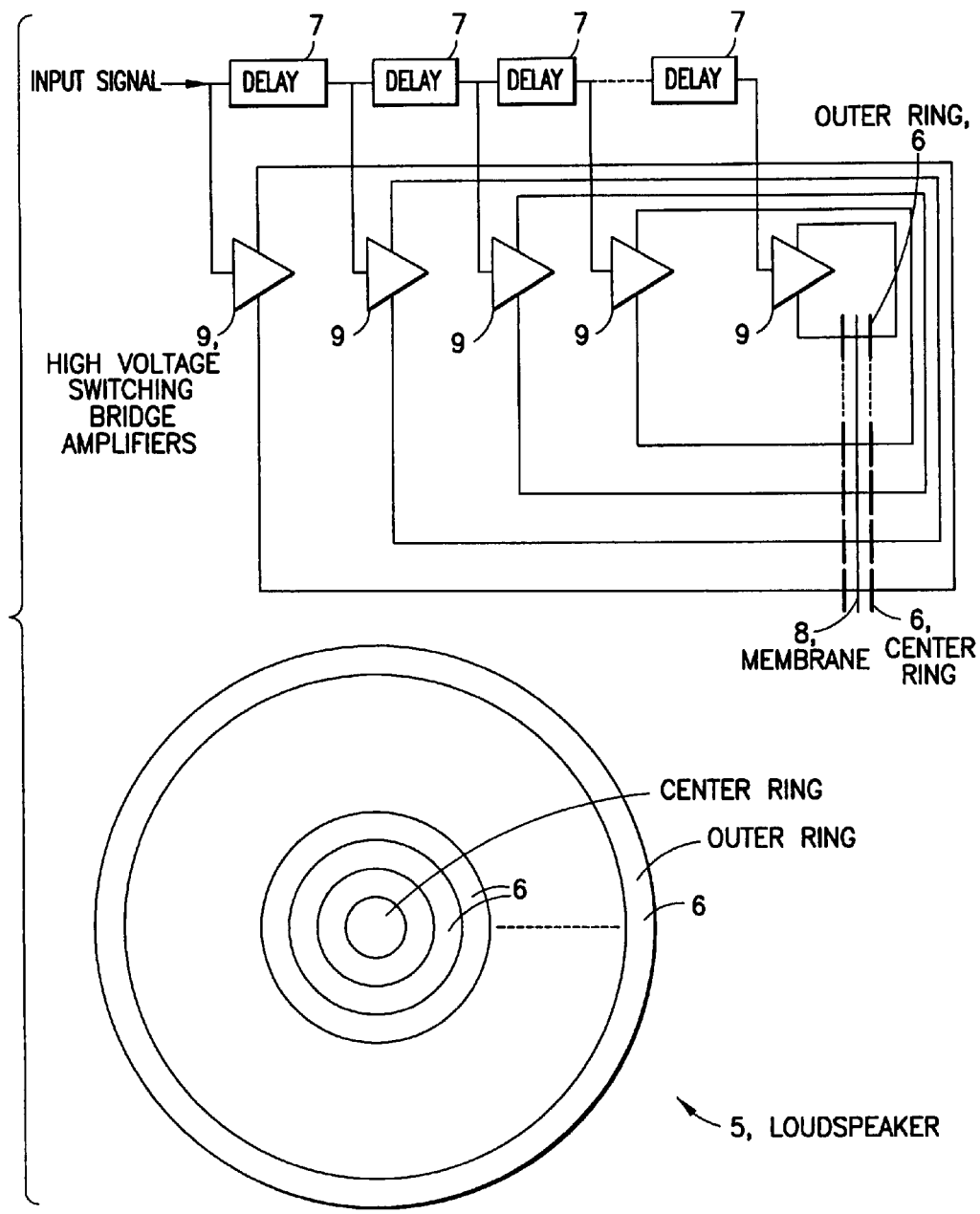
FIG. 1 shows a dipole loudspeaker schematic diagram in accordance with the exemplary embodiments.
Figure 2:
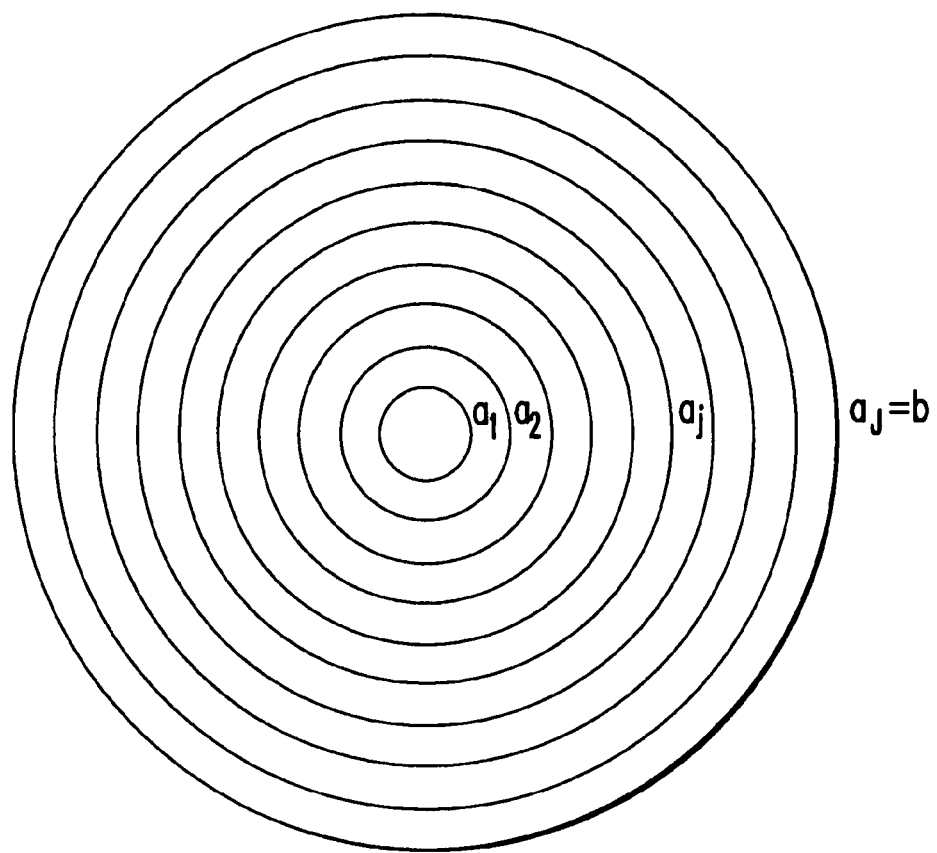
FIG. 2 illustrates the geometry of an embodiment of planar concentric ring sources.

An electrostatic or electret implementation of a loudspeaker 5 in accordance with the exemplary embodiments is shown in the schematic diagram of FIG. 1. There are n concentric ring electrodes 6 and a central disk electrode 6. For example, FIG. 2 is related to a non-limiting example where n=9. In this non-limiting embodiment a plurality of serially connected phase delay elements 7 is provided to progressively delay an input signal and thus generate a progressively increasing delay starting from the central (disk) electrode 6 and working towards the outer (ring) electrode 6. In the illustrated embodiment the input signal is not delayed before being applied to the center electrode 6, the central disk. Although circular concentric electrodes are shown, they can assume any shape including elliptical or rectangular rings. Disposed between opposing pairs of electrodes 6 is a membrane 8. In this exemplary embodiment each pair of the n+1 electrodes 6 is driven by a respective one of a plurality of n+1 bridge amplifiers 9. The bridge amplifiers 9 have anti-phase outputs that are applied across the outer electrodes on either side of the membrane 8. In the case of an electret speaker, the central membrane 8 contains the polarizing charge and is therefore not connected. In the case of a conventional electrostatic speaker, the central membrane 8 has a conductive coating that may be connected to a supply terminal when driven by the switching bridge amplifier 9. This is possible because the average output of the amplifier switching frequency is half of the rail voltage, which then provides the polarization.

It is pointed out that the circuit topology shown in FIG. 1 is but one non-limiting embodiment of circuitry that can be used. For example, there could there be a single amplifier providing the plurality of channels. For example, conventional speaker arrangements in some mobile phone products currently employ class-D amplifiers with stereo outputs, where each output is individually controlled (e.g., gain and possibly also delay). This type of arrangement could be used with the acoustic transducer (loudspeaker 5) shown in FIG. 1.

For example, if it is needed to amplify 10 different signals a 10-way cross-over network, having the time delays and gains, can be located after the amplifier.

It can be noted that existing conventional class D amplifiers can be bridge amplifiers with differential outputs, which is advantageous as such a system can be used when anti-phase outputs are needed to drive the electrodes 6. Otherwise the supply voltage can be doubled. Generally, the wording "switching" can be used to cover class-D, sigma-delta, pulse-width modulation or any other non-analog scheme. In general, the amplifiers or amplifier, and possibly related circuitry, can be integrated into a chip.

Figure 3:
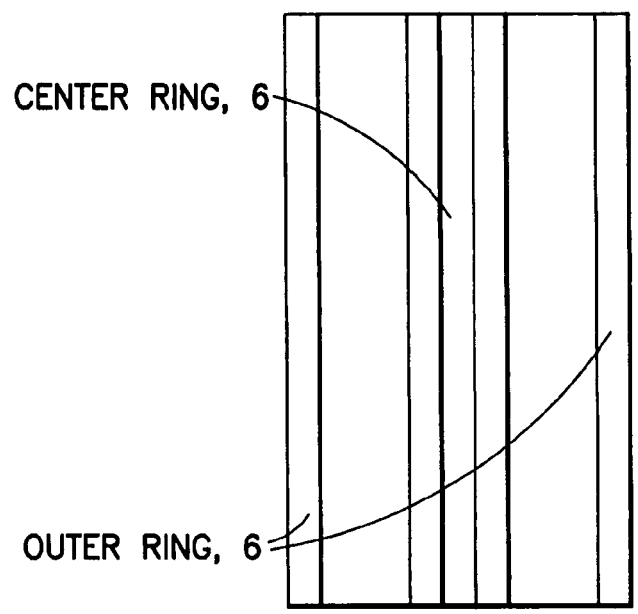
FIG. 3 shows an alternative dipole loudspeaker schematic diagram in accordance with the exemplary embodiments.

FIG. 3 shows an alternative dipole loudspeaker schematic diagram in accordance with the exemplary embodiments. The front view shown illustrates an alternate rectangular arrangement for wide directivity in the horizontal plane but narrow directivity in the vertical plane. The arrangement is suitable for large aspect ratios and gives enhanced bass performance because the sound is concentrated in a 2-dimensional plane.

Similar to the concentric circle pattern see in FIG. 1, in the case of a rectangular column speaker (e.g., where one dimension is greater than the wavelength) it is possible to use a series of long strips with a similar kind of delay pattern. The strips may be located symmetrically about a center strip.

Figure 4:
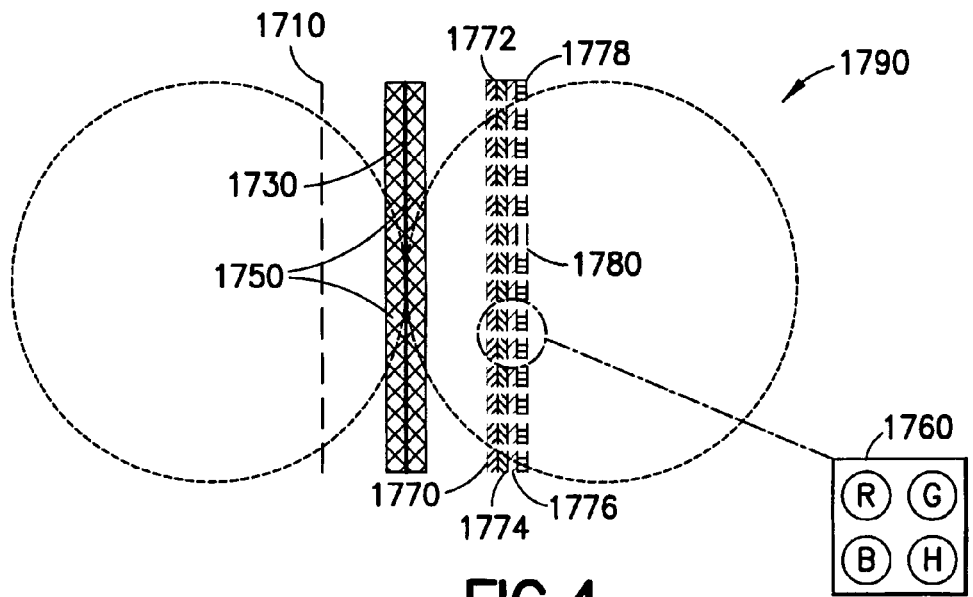
FIG. 4 shows another alternative dipole loudspeaker schematic diagram in accordance with the exemplary embodiments.

FIG. 4 shows another alternative dipole loudspeaker schematic diagram in accordance with the exemplary embodiments. Shown is a dipole implementation of a combined loudspeaker and display using electret type speaker. Other types of speakers could be used such as conventional electrostatic, piezoelectric or electrodynamic.

A rear electrode 1710 (with holes and partitions) is placed behind a conductive film 1730 which is sandwiched between two porous charge storing membranes 1750. A front electrode 1770 (shown with holes and partitions) is shown behind a display 1772. Layered on top of the display are a haptic transducer 1774 and a touch sensor 1776. On the outer surface is a protective coating 1778. Distributed across the front element are invisible sound holes 1780 which are smaller than pixels and may be optimized for damping membrane modes. A dipole polar response 1790 of the speaker is shown. A front view of a pixel set 1760 is shown with red (R), green (G) and blue (B) LEDs and also includes a hole (H). In order to avoid regular patterns the distribution of the LEDs and hole could be randomized.

Figure 5:
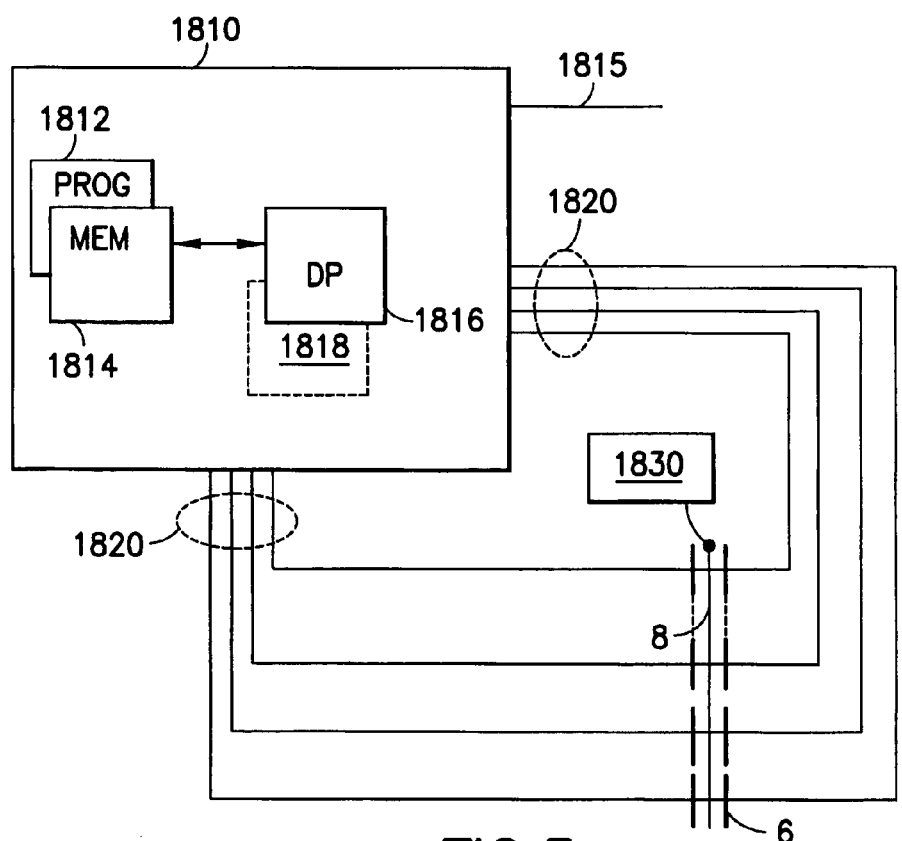
FIG. 5 shows a further alternative schematic diagram in accordance with the exemplary embodiments.

FIG. 5 shows a further alternative schematic diagram in accordance with the exemplary embodiments. The apparatus 1810 includes a controller, such as a computer or a data processor (DP) 1816 and a computer-readable memory medium embodied as a memory (MEM) 1814 that stores a program of computer instructions (PROG) 1812. The apparatus 1810 provides signals 1820 to the electrodes 6 disposed as opposing pairs of electrodes 6 around the membrane 8. Membrane 8 may be connected to a voltage source (for example, when apparatus 1810 is an electrostatic loudspeaker).

The apparatus 1810 may receive an input 1815 which is then processed into signals 1820. Signals 1820 may be progressively delayed starting from the central (disk) electrode 6 and working towards the outer (ring) electrode 6.

In an alternative embodiment, at least three segmentations (e.g., rings/strips) are implemented. This arrangement is effective when the width of each segmentation is less than the wavelength of the sound produced. When the wavelength is smaller than the width of the rings/strips, the speaker may become more directive.

The PROG 1812 is assumed to include program instructions that, when executed by the associated DP, enable the device to operate in accordance with exemplary embodiments of this invention, as will be discussed below in greater detail.

That is, various exemplary embodiments of this invention may be implemented at least in part by computer software executable by the DP 1816 of the apparatus 1810, or by hardware, or by a combination of software and hardware (and firmware). The apparatus 1810 may also include dedicated processors, for example sound processor 1818.

In general, the various embodiments of the apparatus 1810 can include, but are not limited to, cellular telephones, personal digital assistants (PDAs), portable computers, image capture devices such as digital cameras, gaming devices having wireless communication capabilities, music storage and playback appliances, Internet appliances permitting Internet access and browsing, as well as portable units or terminals that incorporate combinations of such functions.

The computer readable MEM 1814 may be of any type suitable to the local technical environment and may be implemented using any suitable data storage technology, such as semiconductor based memory devices, flash memory, magnetic memory devices and systems, optical memory devices and systems, fixed memory and removable memory. The DPs 1816 may be of any type suitable to the local technical environment, and may include one or more of general purpose computers, special purpose computers, microprocessors, digital signal processors (DSPs) and processors based on a multicore processor architecture, as non-limiting examples.

Figure 6:
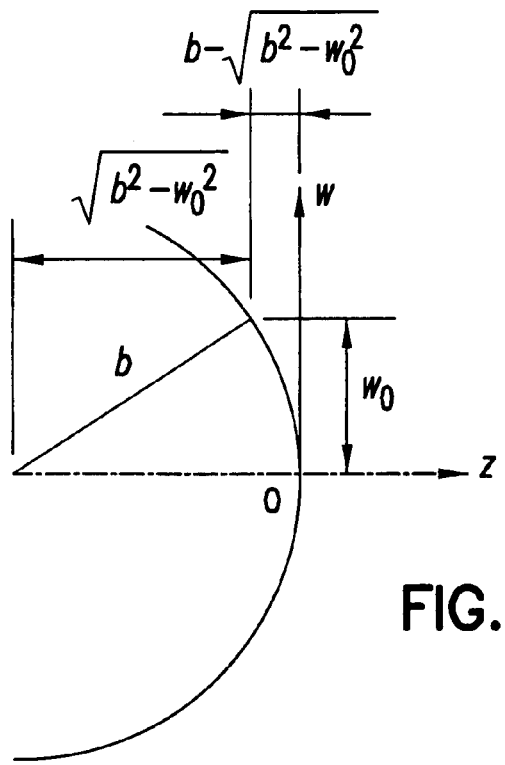
FIG. 6 depicts the geometry of a hemispherical delay path length.

A sketch of how the delay path length is derived from the distance between the diaphragm and an imaginary sphere is shown in FIG. 6 It can be seen that the length is $b-\sqrt{b^2-w^2}$ where b is the radius of the diaphragm and w is the radial distance. Hence the path length is zero at the center and b at the rim.

Figure 7A:
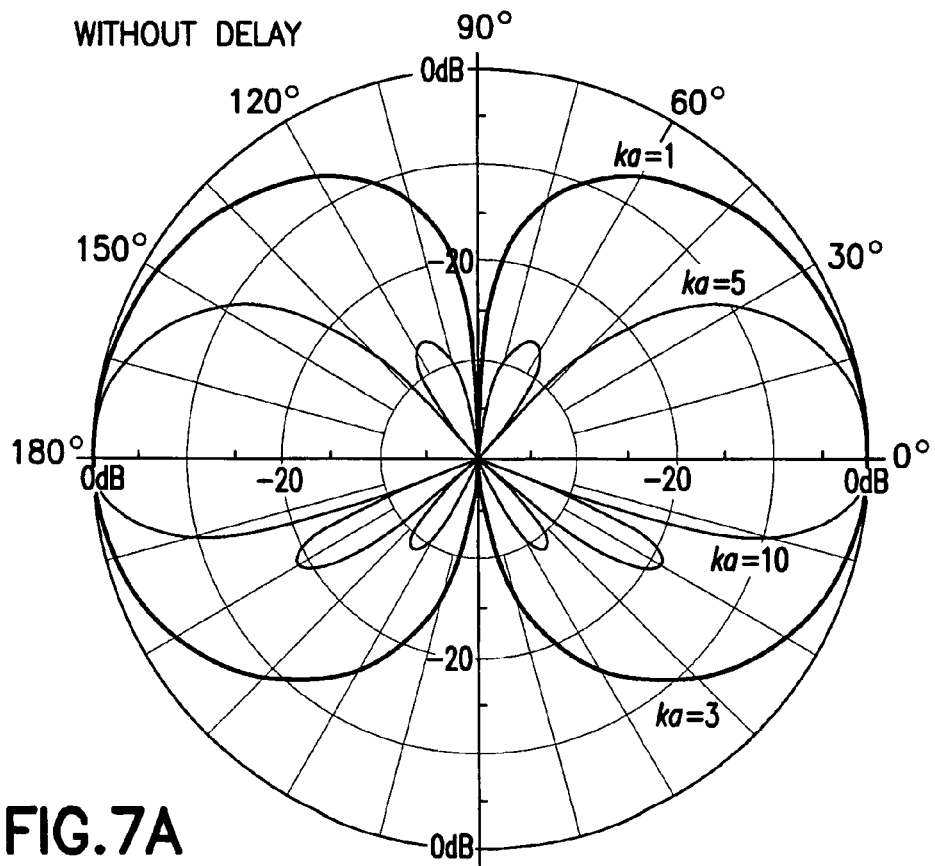
FIGS. 7A, 7B and 7C, collectively referred to as FIG. 7, illustrate on-axis responses and directivity patterns without and with delay.
Figure 7B:
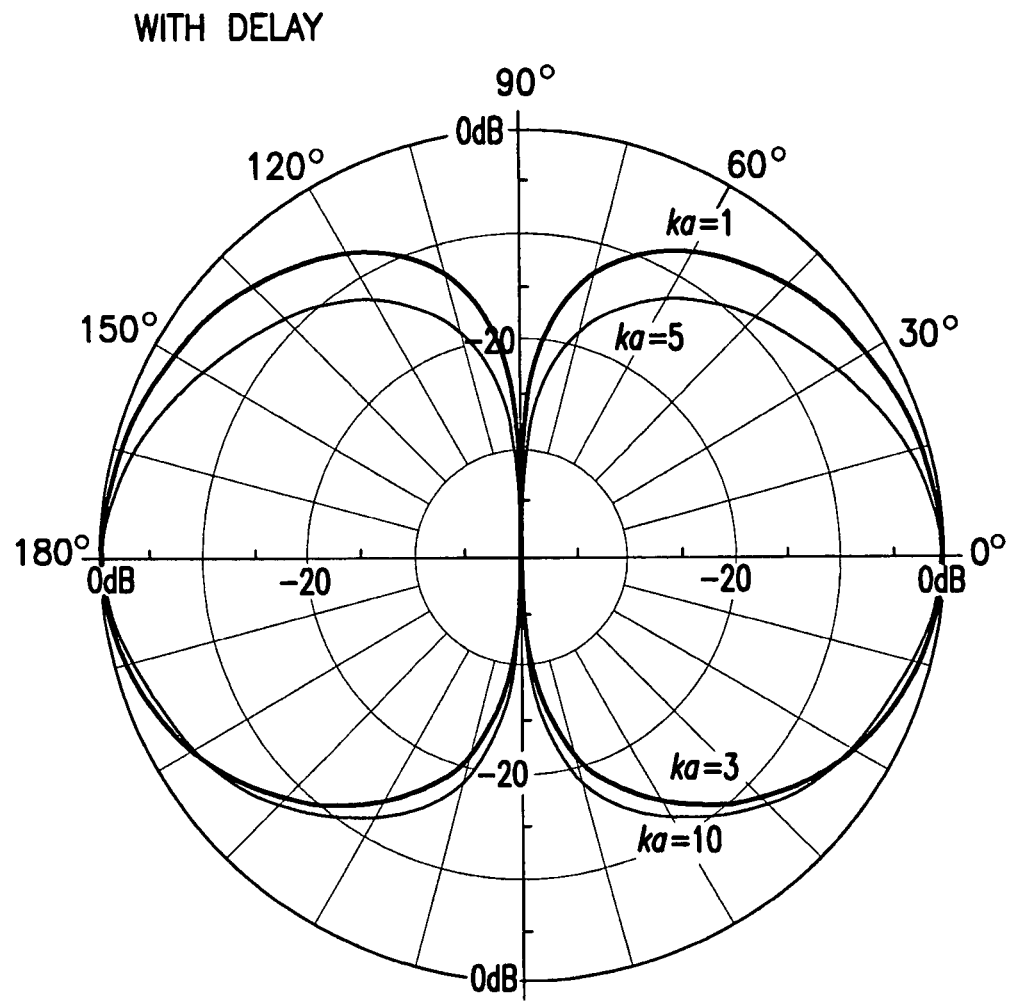
Figure 7C:
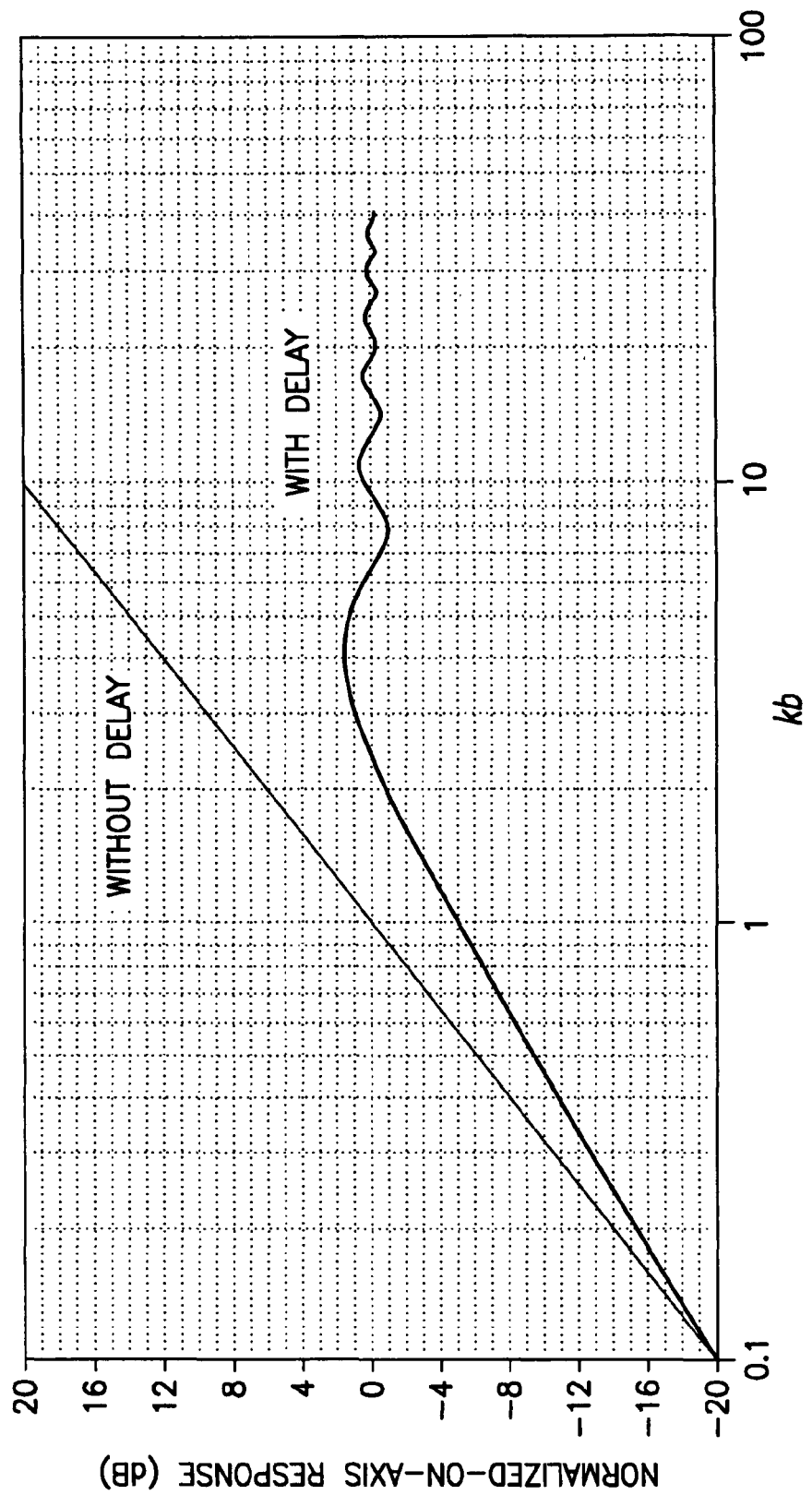

FIGS. 7A, 7B and 7C show the differences between the on-axis responses and directivity patterns without (FIG. 7A) and with (FIG. 7B) the progressive delay. With the delay, it can be seen that the directivity pattern is much broader and the on-axis response is flattened at the higher frequencies.

Figure 8:
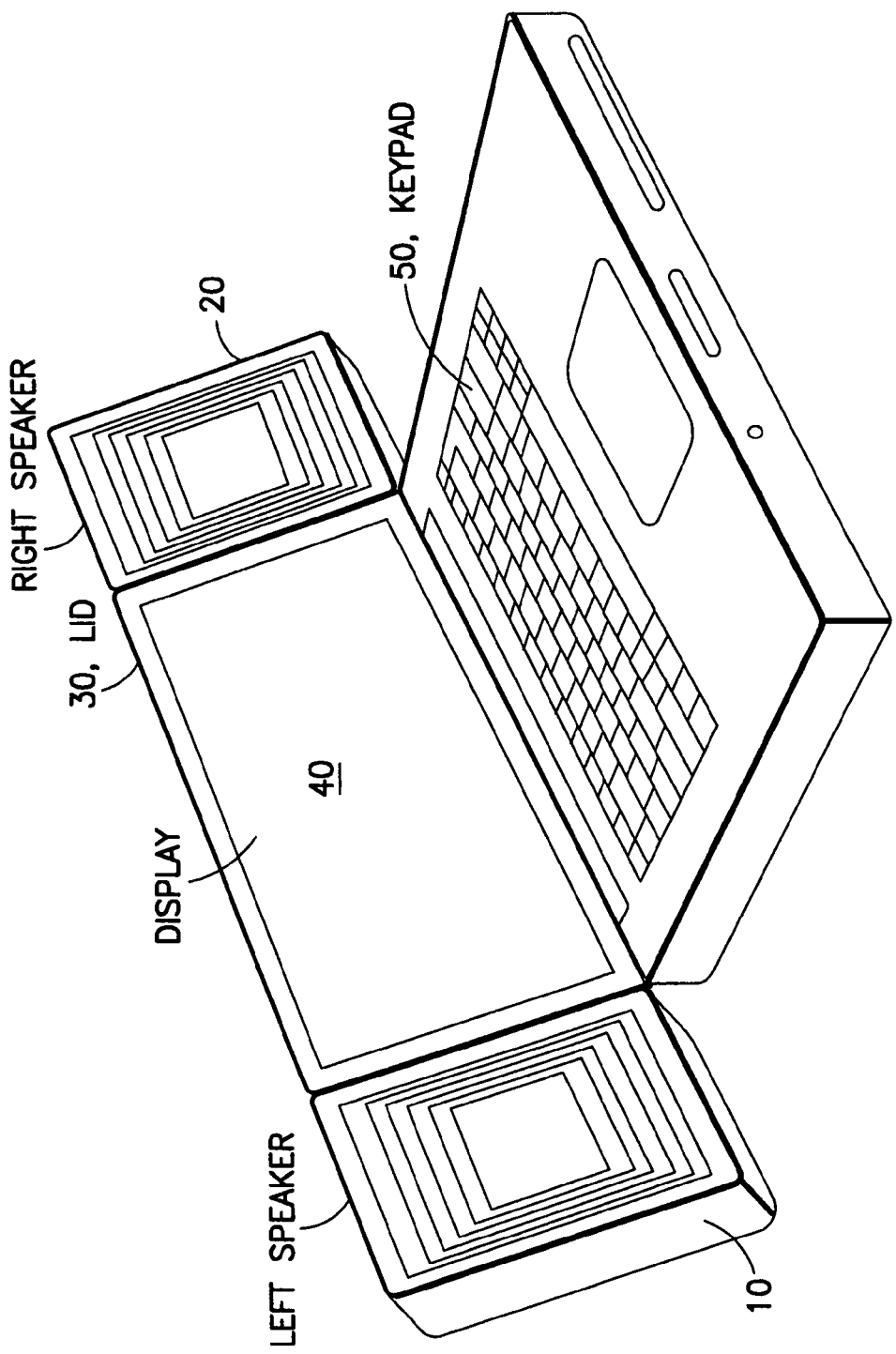
FIG. 8 is one non-limiting example of the loudspeakers deployed in a particular non-limiting product implementation.

FIG. 8 shows an exemplary product implementation where stereo speakers 10 (left) and 20 (right) can either slide out of a lid 30 from behind a display 40 or fold out on hinges. A keypad 50 is shown as a point of reference disposed on body of the device so that it is covered when the lid 30 is closed. The loudspeakers 10 and 20 are each constructed in accordance with the exemplary embodiments of the loudspeaker 5 of this invention as shown in FIG. 1.

It should be noted that in other embodiments the loudspeaker 5 of FIG. 1 could be disposed behind the display 40 in a parallel arrangement with a display layer that displays images to a user. At least one member of each of the pairs of electrodes 6 could be formed on or as a layer of the display 40.

In general, the various embodiments of the device can include, but are not limited to, cellular telephones, personal digital assistants (PDAs), portable computers, image capture devices such as digital video cameras having an audio output, gaming devices, music storage and playback appliances, Internet appliances permitting wired or wireless Internet access and browsing, as well as portable units or terminals that incorporate combinations of such functions.

It is noted that in theory one might attempt arrange arrays of electrodynamic or piezoelectric loudspeakers into ring arrays, or somehow make special ring shaped speakers, but their resonant frequencies would be much higher than that of a single transducer covering the entire area, thus losing bass extension. As a result, it is difficult to imagine what advantage would be gained. Also, electrodynamic or piezoelectric speakers are not pressure transducers but velocity sources. As a result the driving voltage would need to be varied as well as the phase in order to approximate a pressure source.

Also, there is a monopole "complement" of this dipole speaker in which the concentric rings are mounted in an infinite baffle and have uniform velocity magnitude instead of uniform pressure but with exactly the same delay function. However, due to the nature of velocity sources discussed above and the need for a back cavity in order to make the monopole source, it is difficult to see what advantage would be gained.

An electrostatic or electret speaker is essentially a pressure transducer meaning that the electrostatic driving force is automatically uniform over the radiating surface, except at the rim where the membrane is clamped. Only the phase delay has to be varied in order to meet the criteria of the exemplary embodiments of this invention. With an electrostatic or electret implementation the loudspeaker could be made very thin without any kind of back cavity. The dipole directivity pattern gives a degree of privacy in public spaces because there is no lateral dispersion. The physical volume of the loudspeaker is not much greater than the amount of air it displaces, unlike conventional electrodynamic types, because there is no magnet and basket structure.

The efficiency of an electrostatic sound production can be greater than that of some other loudspeaker implementations and, as a result, the operating current can be smaller. This relaxes the requirements of the high voltage driving hardware, including amplifiers and battery voltage up converter, enabling the hardware to be integrated into a small form factor chip or module.

The foregoing exemplary embodiments of this invention will now be described in further detail.

In the ensuing discussion analytical equations describing radiation characteristics of an oscillating ring in a circular finite baffle are derived, including the case of a dipole point source at the center. An oscillating sphere would represent the ideal dipole source, having a constant directivity pattern at all frequencies, but would be inconvenient to realize especially in portable devices. It is found that a planar piston with uniform surface velocity but variable phase arranged to emulate the sphere does not have such a smooth on-axis response as the sphere. Instead a planar piston with the same phase distribution but uniform pressure represents an ideal planar source with a smooth on-axis response and near constant directivity. The surface velocity is plotted and it is then shown that a similar response can be achieved using a finite number of concentric rings based on this velocity distribution.

In recent years, interest in finding analytical solutions to the problems of axi-symmetric radiators in an infinite baffle has continued, whether the surface velocity distribution be uniform or non-uniform. Cases where the surface velocity is unknown are particularly challenging and have been approached in a number of different ways, which are interesting to compare. The same kinds of approaches also have to be applied to axi-symmetric radiators in free space where the surface pressure distributions are unknown. For example, M. Aarts and A. J. Janssen, "Sound radiation quantities arising from a resilient circular radiator," J. Acoust. Soc. Am. 121(2), 759-765 (2006), use a trial function based on Zernike polynomials (F. Zernike, "Beugungstheorie des Schneidensverfahrens and seiner verbesserten Form, der Phasenkontrastmethode (Diffraction theory of the knife-edge test and its improved form, the phase-contrast method)," Physica, 1, 689-704 (1934)), to good effect in order to solve the reverse problem for a resilient radiator in an infinite baffle: By measuring the near field axial pressure, the surface velocity distribution can be evaluated.

In the ensuing description a derivation is presented for the sound field of a ring source in a circular baffle or, by means of superposition of fields, any number of concentric ring sources. By driving these ring sources with signals of differing amplitudes and phases, a highly-focused or widely-dispersed sound field can be synthesized. The latter finds applications in loudspeakers because producing a spatially omni-directional source at all frequencies would normally require a very small source size, but producing enough volume velocity from such a source is not always possible. Hence an attractive solution is to use an extended source with annular rings, which can be combined to produce an omni-directional far field pattern. However, traditional approaches assume the need to attenuate the output of the outer rings at high frequencies using lossy delay lines in order to minimize the edge effect, but what is really desired is to have constant radiated power with a uniform cosine directivity pattern. Herein this is shown to be achieved by keeping the surface pressure distribution uniform and adjusting the phase.

Also described is an optimization of the relative velocity amplitudes and phases of the rings. The ring patterns could be carefully driven electrostatic, piezoelectric or electret speaker designs (T. J. Mellow, and L. M. Kärkkäinen, "On the forces in single-ended and push-pull electret transducers," J. Acoust. Soc. Am. 124(3), 1497-1504 (2008), see also T. J. Mellow and L. M. Kärkkäinen, "A dipole loudspeaker with a balanced directivity pattern," J. Acoust. Soc. Am., 128(5): 2749-2757 (2010)).

Although transducer arrays are traditionally evaluated in an infinite baffle for computational simplicity, the free space case is often closer to reality and enables a truer picture of the low frequency limit to be ascertained.

In the following Zernike polynomials are not chosen because the incomplete integrals for the ring sources would not lead to closed-form solutions. Instead, the Bouwkamp-Streng trial function is used (C. J. Bouwkamp, "Theoretical and numerical treatment of diffraction through a circular aperture," IEEE Transactions of Antennas and Propagation AP18-2, 152-176 (1970), H. Streng, "Calculation of the surface pressure on a vibrating circular stretched membrane in free space," J. Acoust. Soc. Am. 82(2), 679-686 (1987), which is based on the solution to the Helmholtz wave equation in oblate spheroidal coordinates. This is a simple function and has been found by the inventors to converge just as well as any other. Although the power series matching method has been found to be the most efficient for unbaffled radiators, the least-mean-squares method, as used herein, appears to save processing power for a ring or piston in a finite baffle, because the integrals are all solved analytically, unlike previously where numerical integration had been performed.

Ring and Point Source in a Circular Baffle

Figure 9:
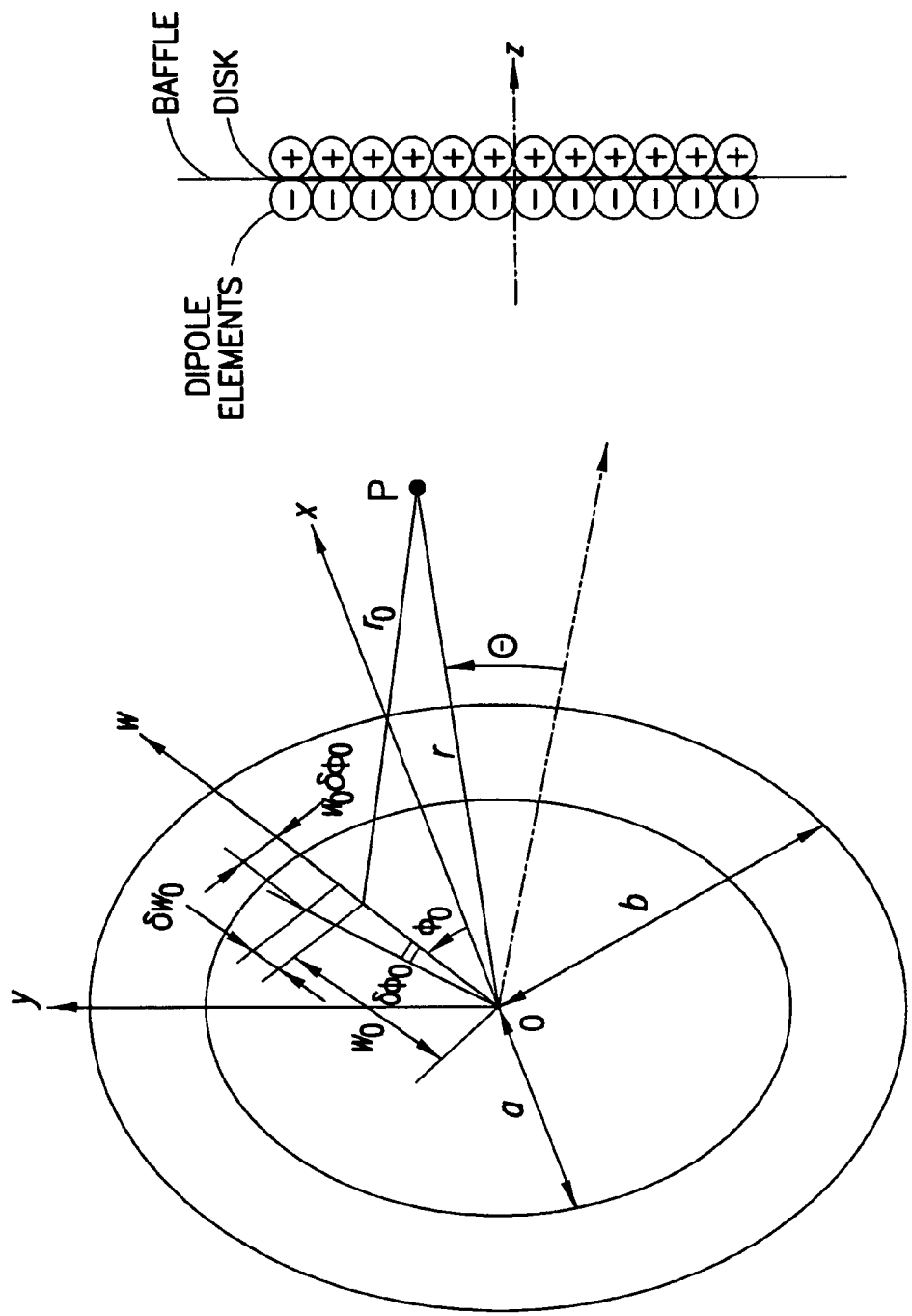
FIG. 9 illustrates the geometry of rigid circular disk in finite baffle, where a point of observation P is located at a distance r and angle θ with respect to the origin at the center of the disk.

A ring of radius a shown in FIG. 9 is mounted in a finite circular baffle of radius b in the xy plane with its center at the origin and oscillates in the z direction with a harmonically time dependent velocity $\tilde{u}_0$, thus radiating sound from both sides into a homogeneous loss-free medium. The dipole source elements shown in FIG. 9 form the disk source. The area of each surface element is given by $\delta S_0 = w_0 \delta w_0 \delta \phi_0$. The pressure field on one side of the xy plane is the symmetrical "negative" of that on the other, so that $$\tilde{p}(w,z) = -\tilde{p}(w,-z). \quad (1)$$

Consequently, there is a Dirichlet boundary condition in the plane of the disk where these equal and opposite fields meet:

$$\tilde{p}(w,0)=0, \ b<w\leq\infty, \quad (2)$$

which is satisfied automatically. There is also a pressure-gradient boundary condition which is dependent upon the velocity distribution over the disk, ring, or baffle. Streng showed that the front and rear surface pressure distributions $\tilde{p}_+(w_0)$ and $\tilde{p}_-(w_0)$ respectively for any flat axially-symmetric unbaffled source (or sink), based upon Bouwkamp's solution to the free space wave equation in oblate spheroidal coordinates, could be written as $$\tilde{p}_+(w_0) = -\tilde{p}_-(w_0) = kb\rho c\tilde{u}_0 \frac{a_2^2}{b^2} \sum_{n=0}^{\infty} A_n \left(n + \frac{3}{2}\right)\left(1 - \frac{w_0^2}{b^2}\right)^{n+\frac{1}{2}} \quad (3)$$

$$0 \leq w_0 \leq b,$$

where $A_n$ are the as yet unknown power series coefficient that will be calculated by means of a set of simultaneous equations in matrix form, k is the wave number given by $k = \omega/c = 2\pi/\lambda$, $\omega$ is the angular frequency of excitation, $\rho$ is the density of the surrounding medium, c is the speed of sound in that medium, and $\lambda$ is the wavelength. The tilde denotes a steady-state harmonically-varying quantity, otherwise denoted by the factor $e^{i\omega t}$. In this description, i represents the positive square root of $-1$ and is thus equivalent to the imaginary operator j used in circuit theory. Equation (3) is the same as that previously used by the inventors (T. J. Mellow, and L. M. Kärkkäinen, "On the sound field of an oscillating disk in an open and closed circular baffle," *J. Acoust. Soc. Am.* 118 (3), 1311-1325 (2005)) with the exception that in its present form it has been multiplied by $a_2^2/b^2$ in order to facilitate the solution in the limiting case of a point source. This also simplifies subsequent expressions for the radiation impedance and far-field pressure.

Formulation of the Coupled Equation

The near-field pressure distribution is given by the following dipole boundary integral taking into account the surface pressure on both sides $$\tilde{p}(w, z) = \quad (4)$$

$$\int_0^{2\pi} \int_0^b (\tilde{p}_+(w_0) - \tilde{p}_-(w_0)) \frac{\partial}{\partial z_0} g(w, z | w_0, z_0) \Big|_{z_0 = 0+} w_0 dw_0 d\phi_0,$$

where the Green's function in axi-symmetric cylindrical coordinates is given by $$g(w, z | w_0, z_0) = \frac{-i}{2\pi} \int_0^{\infty} J_0(\mu w) J_0(\mu w_0) \frac{\mu}{\sigma} e^{i\sigma|z - z_0|} d\mu. \quad (5)$$

where $$\sigma = \begin{cases} \sqrt{k^2 - \mu^2}, & 0 \leq \mu \leq k \\ -i\sqrt{\mu^2 - k^2}, & \mu > k, \end{cases} \quad (6)$$

In this form Eq. (4) is known as the dipole King integral. Inserting Eqs. (3) and (5) into Eq. (4) and integrating over the surface of the disk and baffle gives $$\tilde{p}(w, z) = \quad (7)$$

$$-ka_2^2 \rho c\tilde{u}_0 \sum_{n=0}^{\infty} A_n \Gamma\left(n + \frac{5}{2}\right) \int_0^{\infty} \left(\frac{2}{\mu b}\right)^{n+\frac{1}{2}} J_0(\mu w) J_{n+\frac{3}{2}}(\mu b) e^{-i\sigma|z|} d\mu,$$

where the following Sonine's integral solution has been used:

$$\int_0^b \left(1 - \frac{w_0^2}{b^2}\right)^{n+\frac{1}{2}} J_0(\mu w_0) w_0 dw_0 = \frac{b^2}{2} \Gamma\left(n + \frac{3}{2}\right) \left(\frac{2}{\mu b}\right)^{n+\frac{3}{2}} J_{n+\frac{3}{2}}(\mu b). \quad (8)$$

At the surface of the disk, there is the coupling condition $$\frac{\partial}{\partial z} \tilde{p}(w, z)\big|_{z=0} = -ik\rho c\tilde{u}_0 \Phi(w), \quad (9)$$

where $\Phi(w)$ is a dimensionless function of the surface velocity distribution. In this description different expressions for $\Phi(w)$ will be used when considering a ring or point source in a circular baffle. This leads to the following coupled equation $$\sum_{n=0}^{\infty} A_n I_n(w) = -\Phi(w), \quad (10)$$

which is to be solved for the power series coefficients $A_n$. The integral $I_n(w)$ can be split into two parts, $$I_n(w) = I_{nR}(w) - iI_{nI}(w), \quad (11)$$

where the real part is given by $$I_{nR}(w) = a_2^2 \Gamma\left(n + \frac{5}{2}\right) \int_0^k \left(\frac{2}{\mu b}\right)^{n+\frac{1}{2}} J_{n+\frac{3}{2}}(\mu b) J_0(\mu w) \sqrt{k^2 - \mu^2} \, d\mu \quad (12)$$

and the imaginary part is given by $$I_{nI}(w) = a_2^2 \Gamma\left(n + \frac{5}{2}\right) \int_k^{\infty} \left(\frac{2}{\mu b}\right)^{n+\frac{1}{2}} J_{n+\frac{3}{2}}(\mu b) J_0(\mu w) \sqrt{\mu^2 - k^2} \, d\mu. \quad (13)$$

The solutions to these integrals can be shown to be given by $$I_{nR} = \sqrt{\pi} \frac{a_2^2}{b^2} \quad (14)$$

$$\sum_{m=0}^{\infty} \sum_{r=0}^{\infty} \frac{(-1)^{m+r} \Gamma\left(n + \frac{5}{2}\right) \Gamma(m + r + 1)}{(m!)^2 r! \Gamma\left(r + n + \frac{5}{2}\right) \Gamma\left(m + r + \frac{5}{2}\right)} \left(\frac{kb}{2}\right)^{2(m+r)+3} \left(\frac{w}{b}\right)^{2m},$$

$$I_{nI}(w) = \quad (15)$$

$$\sqrt{\pi} \frac{a_2^2}{b^2} \sum_{m=0}^{\infty} \sum_{r=0}^{\infty} \frac{(-1)^{m+r+n} \Gamma\left(n + \frac{5}{2}\right) \Gamma\left(m + r - n - \frac{1}{2}\right)}{(m!)^2 r! \Gamma\left(r - n - \frac{1}{2}\right) \Gamma(m + r - n + 1)} \left(\frac{kb}{2}\right)^{2(m+r-n)}$$

$$\left(\frac{w}{b}\right)^{2m}.$$

Solution of the Power Series Coefficients for a Ring in a Circular Baffle

In the case of a disk in free space the power-series matching method gives acceptable results, but for a disk or finite ring in a circular baffle a more efficient method is to employ the following least-mean-squares (LMS) algorithm From Eq. (10), let an error function be defined by $$E(A_n) = \int_0^b \left|\sum_{n=0}^{\infty} A_n I_n(w) + \Phi(w)\right|^2 w dw, \quad (16)$$

where $$\Phi(w) = \begin{cases} 0, & 0 \leq w < a_1 \\ 1, & a_1 \leq w \leq a_2. \\ 0, & a_2 < w \leq b. \end{cases} \quad (17)$$

In order to find the values of $A_n$ that minimize the error, the derivative of E is taken with respect to $A_n$ and the result equated to zero $$\frac{\partial}{\partial A_n} E(A_n) = 2 \int_0^b I_m(w) \left( \sum_{n=0}^{\infty} A_n I_n(w) + \Phi(w) \right) w\, dw = 0, \quad (18)$$

which, after truncating the infinite series limit to order N, yields the following set of N+1 simultaneous equations $$\sum_{n=0}^{N} A_n \int_0^b I_m(w) I_n(w) w\, dw = -\int_{a_1}^{a_2} I_m(w) w\, dw, \quad (19)$$

$$m = 0, 1, \ldots N,$$

$$I_m(w) = \frac{a_2^2}{b^2} \sum_{p=0}^{P} ({}_m B_p(kb) - j\, {}_m B_p(kb)) \left(\frac{w}{b}\right)^{2p}, \quad (20)$$

$$I_n(w) = \frac{a_2^2}{b^2} \sum_{q=0}^{Q} ({}_n S_q(kb) - j\, {}_n B_q(kb)) \left(\frac{w}{b}\right)^{2q}. \quad (21)$$

Integrating over w yields the following N×N matrix equation $$M \cdot a = b, \quad (22)$$

where the matrix M and vectors a and b are given by $$M(m+1, n+1) = \quad (23)$$

$$\sum_{p=0}^{P} \sum_{q=0}^{Q} \frac{({}_m B_p(kb) - j\, {}_m S_p(kb))}{p+q+1} \times ({}_n B_q(kb) - j\, {}_n S_q(kb)),$$

$$\begin{cases} m = 0, 1, \ldots, N' \\ n = 0, 1, \ldots, N \end{cases}$$

$$b(m+1) = -\sum_{p=0}^{P} \frac{({}_m B_p(kb) - j\, {}_m S_p(kb))}{p+1} \left( \left(\frac{a_2}{b}\right)^{2p} - \left(\frac{a_1}{b}\right)^{2p} \left(\frac{a_1}{a_2}\right)^2 \right), \quad (24)$$

$$m = 0, 1, \ldots, N$$

$$a(n+1) = A_n, n = 0, 1, \ldots, N, \quad (25)$$

and the infinite power series limits have been truncated. The dipole cylindrical wave functions ${}_n B_m$ and ${}_n S_m$ are named the Bouwkamp and Streng functions respectively and are defined by $${}_n B_m(kb) = \sqrt{\pi} \sum_{r=0}^{N} \frac{(-1)^{m+r} \Gamma\left(n+\frac{5}{2}\right) \Gamma(m+r+1)}{(m!)^2 r! \Gamma\left(r+n+\frac{5}{2}\right) \Gamma\left(m+r+\frac{5}{2}\right)} \left(\frac{kb}{2}\right)^{2(m+r)+3}, \quad (26)$$

$${}_n S_m(kb) = \sqrt{\pi} \sum_{r=0}^{N} \frac{(-1)^{m+r+n} \Gamma\left(n+\frac{5}{2}\right) \Gamma\left(m+r-n-\frac{1}{2}\right)}{(m!)^2 r! \Gamma\left(r-n-\frac{1}{2}\right) \Gamma(m+r-n+1)} \left(\frac{kb}{2}\right)^{2(m+r-n)}. \quad (27)$$

Solution of the Power Series Coefficients for a Point Source in a Circular Baffle The surface velocity distribution of an infinitesimally narrow ring source of radius $a_1$ in a circular baffle is given by $$\Phi(w) = \frac{1}{2} a \delta(w - a), \quad (28)$$

where $\delta$ is the Dirac delta function. Inserting this into Eq. (18) and truncating the infinite series limit to order N, while letting $a_1 = a_2$, yields the following set of N+1 simultaneous equations $$\sum_{n=0}^{N} A_n \int_0^b I_m(w) I_n(w) w\, dw = -\frac{a}{2} \int_0^b \delta(w-a) I_m(w) w\, dw, \quad (29)$$

$$m = 0, 1, \ldots N,$$

where $I_m(w)$ and $I_n(w)$ are given by Eqs. (20) and (21) respectively. Integrating over w and using the property of the Dirac delta function yields the same matrix equations as Eqs. (22) to (25) except that $$b(m+1) = -\sum_{p=0}^{P} ({}_m B_p(kb) - j\, {}_m S_p(kb)) \left(\frac{a}{b}\right)^{2p}. \quad (30)$$

In the limiting case of a point source at the center of a circular baffle, let $a_1 \to 0$ so that $$b(m+1) = -{}_n B_0(kb) + j\, {}_m S_0(kb) \quad (31)$$

Far-Field Pressure.

The far-field pressure distribution is given by the dipole boundary integral of Eq. (4), but using the far-field Green's function in spherical-cylindrical coordinates:

$$\tilde{p}(r, \theta) = \int_0^{2\pi} \int_0^b (\tilde{p}_+(w_0) - \tilde{p}_-(w_0)) \frac{\partial}{\partial z_0} g(r, \theta, \phi \mid w_0, \phi_0, z_0) \Big|_{\substack{z_0=0+ \\ \phi=\pi/2}} w_0\, dw_0\, d\phi_0, \quad (32)$$

where the far-field Green's function is given by $$g(r, \theta \mid w_0, \phi_0, z_0) = \frac{1}{4\pi r} e^{-ik(r - w_0 \sin\theta \phi_0 - z_0 \cos\theta)} \quad (33)$$

Due to axial symmetry, there is no $\phi$ dependency so that any value can be chosen and a value of $\pi/2$ turns out to be the most convenient for solving the angular integral. Inserting Eqs. (3) and (33) into Eq. (32) and integrating over the surface, using Eq. (8) and $$\frac{1}{2\pi} \int_0^{2\pi} e^{it\sin\phi_0} d\phi_0 = J_0(t), \quad (34)$$

(with $t = kw_0 \sin\theta$, $\mu = k \sin\theta$), and letting $\phi = \pi/2$ so that $\cos(\phi - \phi_0) = \sin\phi_0$ in Eq. (34) gives $$\tilde{p}(r, \theta) = -ika_2^2 \rho c \tilde{u}_0 \frac{e^{-ikr}}{2r} D(\theta), \quad (35)$$

where the directivity function $D(\theta)$ is given by $$D(\theta) = kb\cos\theta \sum_{n=0}^{N} A_n \Gamma\left(n + \frac{5}{2}\right) \left(\frac{2}{kb\sin\theta}\right)^{n+\frac{3}{2}} J_{n+\frac{3}{2}}(kb\sin\theta). \quad (36)$$

The on-axis pressure is evaluated by setting $\theta = 0$ in Eq. (33) before inserting it in Eq. (32) and integrating over the surface to give $$D(0) = kb \sum_{n=0}^{N} A_n, \quad (37)$$

so that the on-axis response can be written as $$\tilde{p}(r, 0) = -i\rho_0 f \tilde{U}_0 \frac{e^{-ikr}}{r} kb \sum_{n=0}^{N} A_n. \quad (38)$$

where $\tilde{U}_0 = \pi a^2 \tilde{u}_0$ is the total volume velocity in the case of $a_1 = 0$. The on-axis response $20 \log_{10}(D(0))$ of a point source in a circular baffle of radius b is plotted in FIG. 10. In the same figure there is also plotted the response in free space of two point sources of opposite phase on the same axis with a separation of b, which is given by $20 \log_{10}|e^{ikb/2} - e^{-ikb/2}|$ or $20 \log_{10}|2i \sin kb/2|$. Using the superposition of fields, the on-axis response of a monopole point source in a closed circular baffle is obtained by combining the dipole point source in an open circular baffle with a monopole point source in free space to obtain $$D(0) = \frac{1}{2}\left(1 + kb \sum_{n=0}^{N} A_n\right). \quad (39)$$

Figure 11:
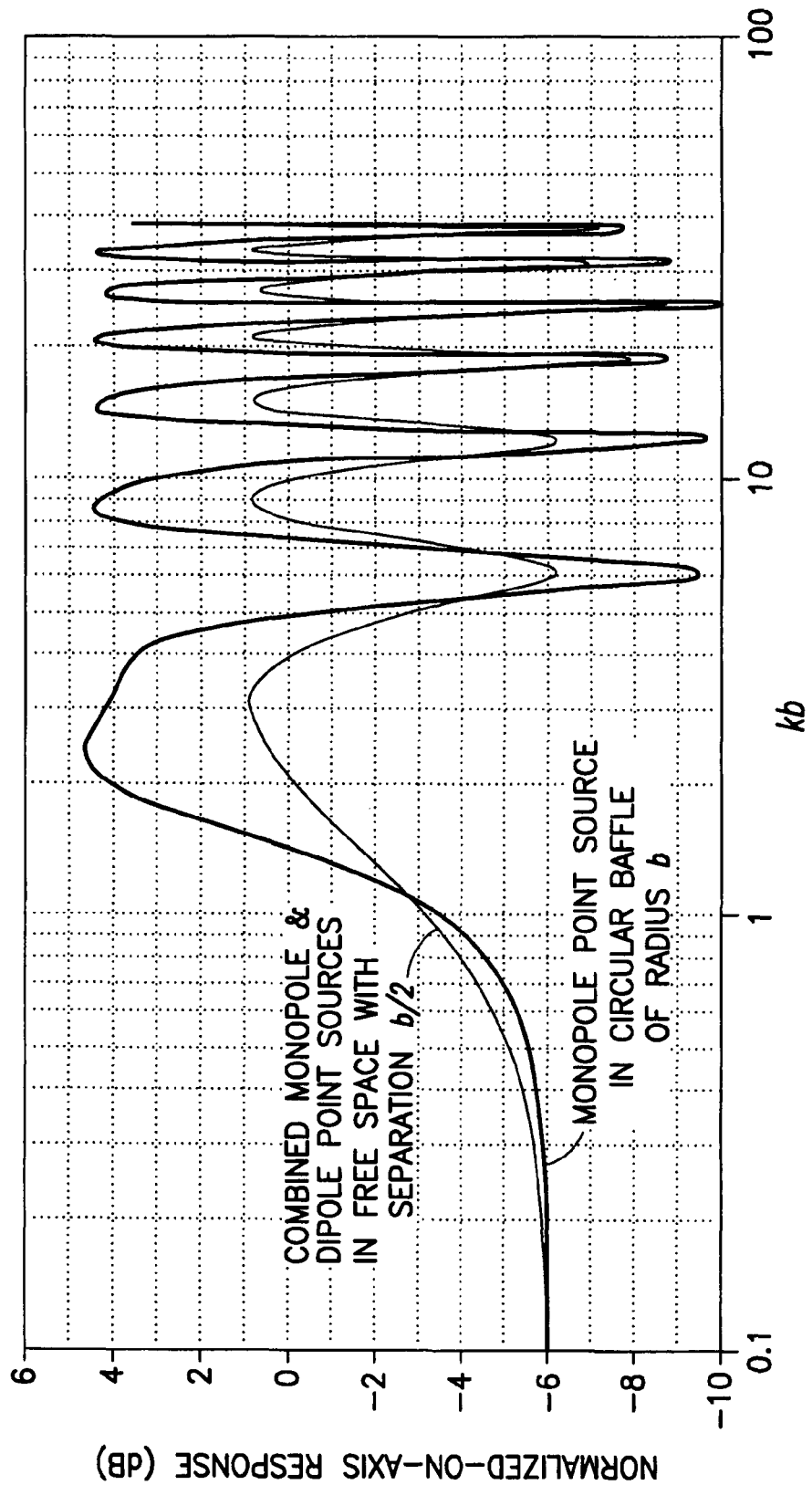
FIG. 11 illustrates the normalized far-field on-axis response of a monopole point source in a circular closed baffle with constant volume acceleration.

The on-axis response $20 \log_{10}(D(0))$ is plotted in FIG. 11. In the same figure there is also plotted the response in free space of two point sources of opposite phase, as before, but with a monopole source half way between them, which is given by $20 \log_{10}|(1 + e^{ikb/2} - e^{-ikb/2})/2|$ or $20 \log_{10}|(1 + 2i \sin kb)/2|$.

Radiation Impedance of a Ring in a Circular Baffle.

The total radiation force is found by integrating the pressure from Eq. (3) over the surface of the ring on both sides to give $$\tilde{F} = -\int_0^{2\pi}\int_{a_1}^{a_2} (\tilde{p}_+(w_0) - \tilde{p}_-(w_0)) w dw d\phi. \quad (40)$$

The specific radiation impedance $Z_s$ is then given by $Z_s = \tilde{F}/\tilde{U}_0 = R_s + jX_s$, where $\tilde{U}_0 = \pi(a_2^2 - a_1^2)\tilde{u}_0$ is the total volume velocity. The specific radiation resistance $R_s$ per side is given by $$R_s = kb\rho c \frac{a_2^2}{a_2^2 - a_1^2} \mathcal{R}\left(\sum_{n=0}^{N} A_n\left\{\left(1 - \frac{a_1^2}{b^2}\right)^{n+\frac{3}{2}} - \left(1 - \frac{a_2^2}{b^2}\right)^{n+\frac{3}{2}}\right\}\right), \quad (41)$$

and the specific radiation reactance $X_s$ per side is given by $$X_s = kb\rho c \frac{a_2^2}{a_2^2 - a_1^2} \mathcal{I}\left(\sum_{n=0}^{N} A_n\left\{\left(1 - \frac{a_1^2}{b^2}\right)^{n+\frac{3}{2}} - \left(1 - \frac{a_2^2}{b^2}\right)^{n+\frac{3}{2}}\right\}\right). \quad (42)$$

Virtual Oscillating Sphere

An ideal dipole sound source is the oscillating sphere which has a perfectly smooth monotonic far-field pressure response and a constant dipole directivity pattern. Three ways to emulate this kind of sound source using a flat circular radiator now described in this section. In a first subsection this is done using a driving velocity distribution of uniform magnitude. In a second subsection the uniform velocity distribution is exchanged for a uniform pressure distribution. In each case a continuously variable delay is applied to the driving velocity or pressure, where the delay path length is $b - \sqrt{b^2 - w_0^2}$ as can be seen from FIG. 6. In a next subsection a velocity source is used, but the velocity magnitude and phase distribution is discretized using separate rings, where the velocity at the midpoint along the radius of each ring is matched to that of the corresponding point on the pressure source of the second subsection.

Virtual Oscillating Sphere Using a Planar Source with Uniform Surface Velocity but Variable Delay A surface velocity distribution which has an increasing delay towards the rim in order to simulate an oscillating sphere of radius b is given by $$\Phi(w) = e^{ik\left(b - \sqrt{b^2 - w^2}\right)} = e^{ikb\left(1 - \sqrt{1 - w^2/b^2}\right)}. \quad (43)$$

where the delay path length at the rim is the radius b of the sphere. Inserting this into Eq. (18) and truncating the infinite series limit to order N yields the following set of N+1 simultaneous equations $$\sum_{n=0}^{N} A_n \int_0^b I_m(w) I_n(w) w dw = -\int_0^b e^{ikb\left(1 - \sqrt{1 - w^2/b^2}\right)} I_m(w) w dw, \quad (44)$$

$$m = 0, 1, \ldots N,$$

where $I_m(w)$ and $I_n(w)$ are given by Eqs. (20) and (21) respectively. Integrating over w yields the same matrix equations as Eqs. (22) to (25) except that $$b(m+1) = \quad (45)$$

$$-\sum_{p=0}^{P} ({}_m S_p(kb) - i {}_m B_p(kb)) \frac{2}{b^{2p+2}} \int_0^b e^{ikb\left(1 - \sqrt{1 - w^2/b^2}\right)} w^{2p+1} dw.$$

Figure 12:
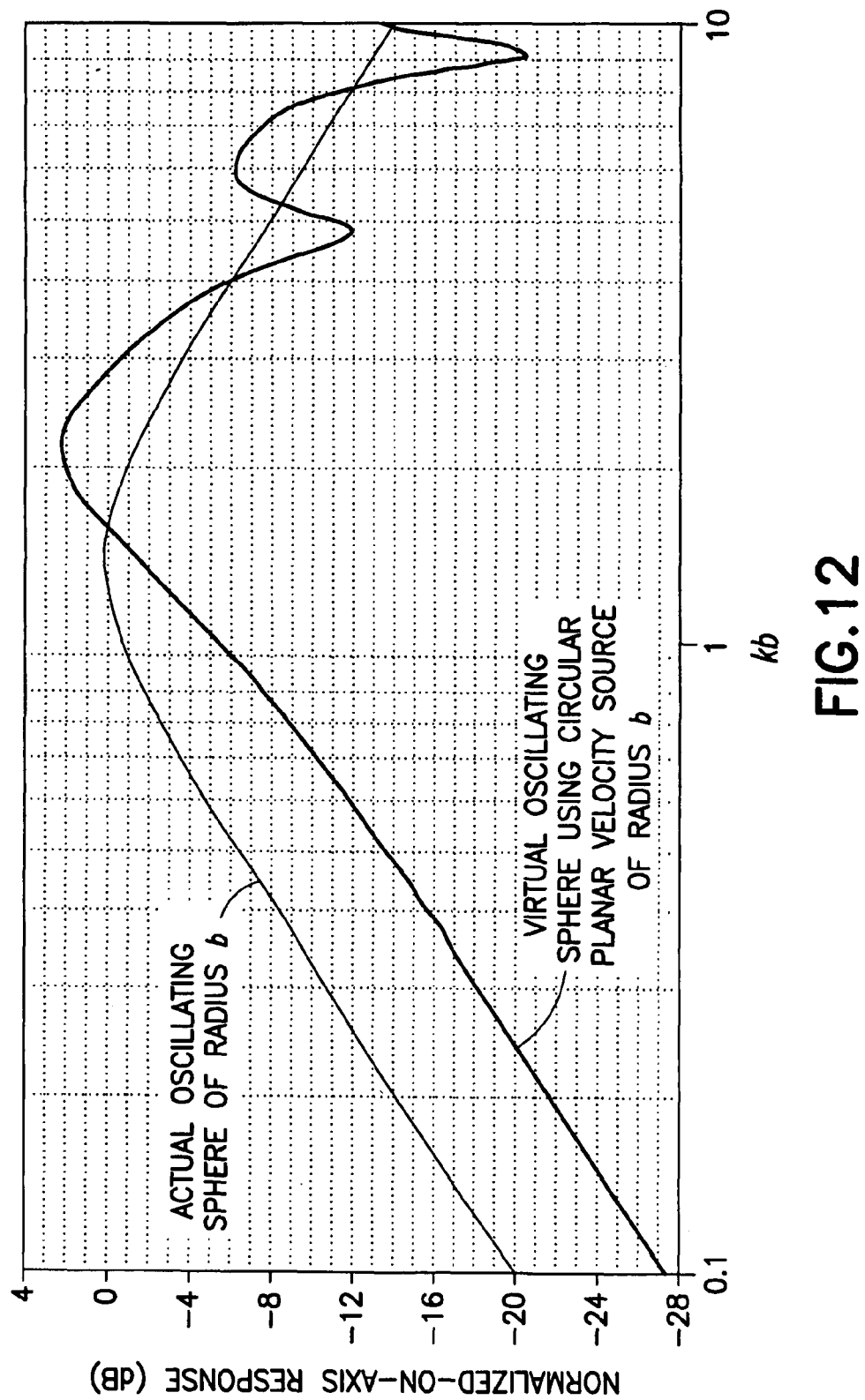
FIG. 12 shows the normalized far-field on-axis response of a virtual oscillating sphere using a planar source with uniform surface velocity magnitude but variable delay.
Figure 13:
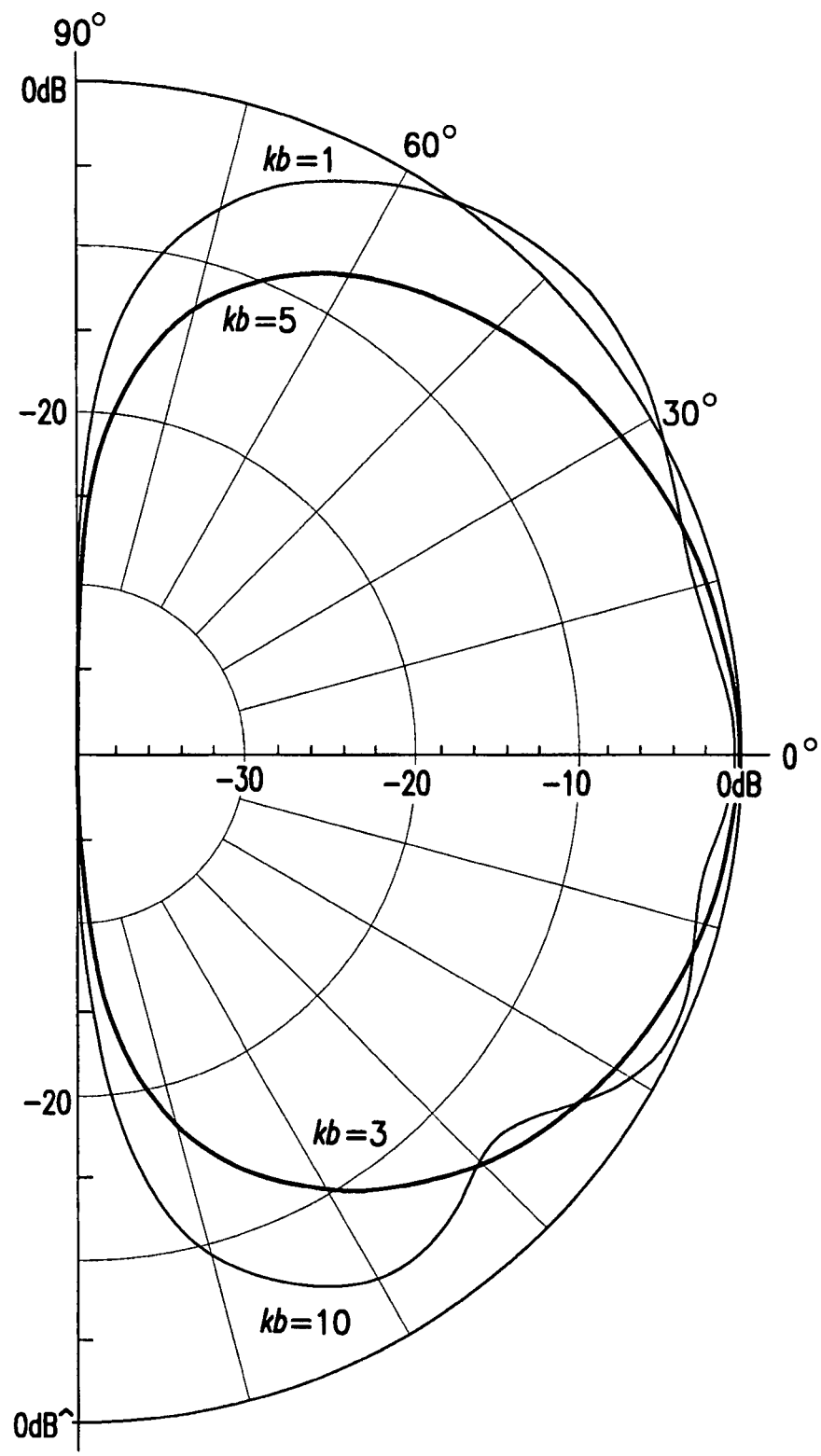
FIG. 13 depicts the normalized far-field directivity pattern of a virtual oscillating sphere using a planar source with uniform surface velocity magnitude but variable delay.

The on-axis response and directivity patterns plotted from Eqs. (37) and (36) are shown in FIGS. 12 and 13, respectively.

Virtual Oscillating Sphere Using a Planar Source with Uniform Surface Pressure but Variable Delay If the loudspeaker is a pressure transducer, as are typically electrostatic types, the surface pressure can be approximated by a uniform driving pressure $\tilde{p}_0$ so that applying the delay of Eq. (43) gives $$\tilde{p}_+(w_0) = -\tilde{p}_-(w_0) = \frac{\tilde{p}_0}{2} e^{ikb\left(1 - \sqrt{1 - w_0^2/b^2}\right)}, \quad (46)$$

$$0 \leq w_0 \leq b.$$

Inserting Eqs. (46) and (33) into Eq. (32) and integrating over the surface using Eq. (34) yields $$\tilde{p}(r, \theta) = -ib\tilde{p}_0 \frac{e^{-ikr}}{4r} D(\theta), \quad (47)$$

Where after substituting $w_0 = bs$ the directivity factor is given by $$D(\theta) = 2kb \cos\theta \int_0^1 e^{ikb\left(1 - \sqrt{1 - s^2}\right)} J_0(kbs \sin\theta) s ds. \quad (48)$$

For the on-axis response, a closed-form solution is given by $$D(0) = \frac{2}{kb}(1 - e^{ikb} + ikb). \quad (49)$$

Figure 14:
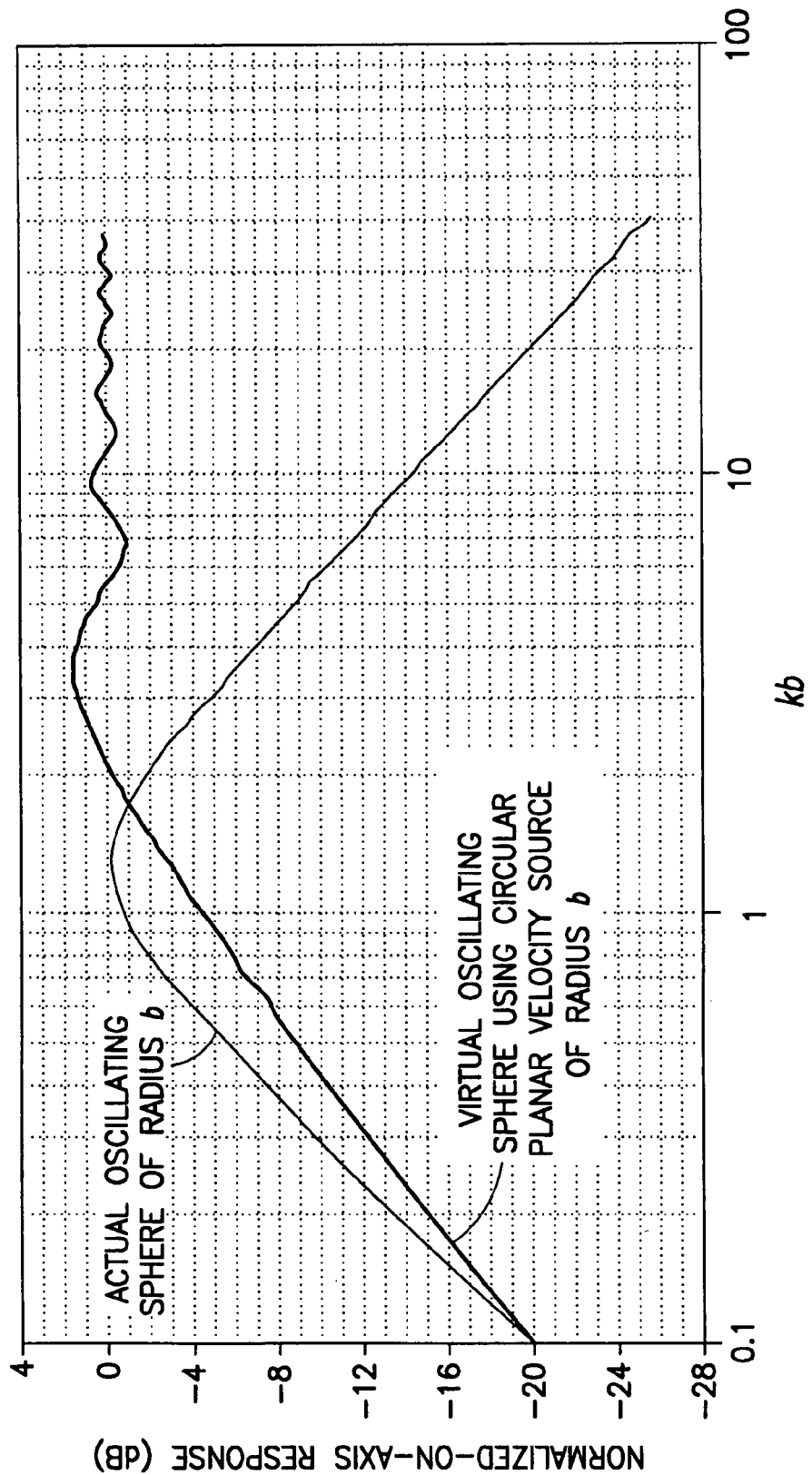
FIG. 14 illustrates the normalized far-field on-axis response of a virtual oscillating sphere using a planar source with uniform surface pressure magnitude but variable delay, where the same frequency response shape can also be obtained from a planar source in an infinite baffle with uniform surface velocity magnitude but variable delay, where the velocity is constant at all frequencies.
Figure 15:
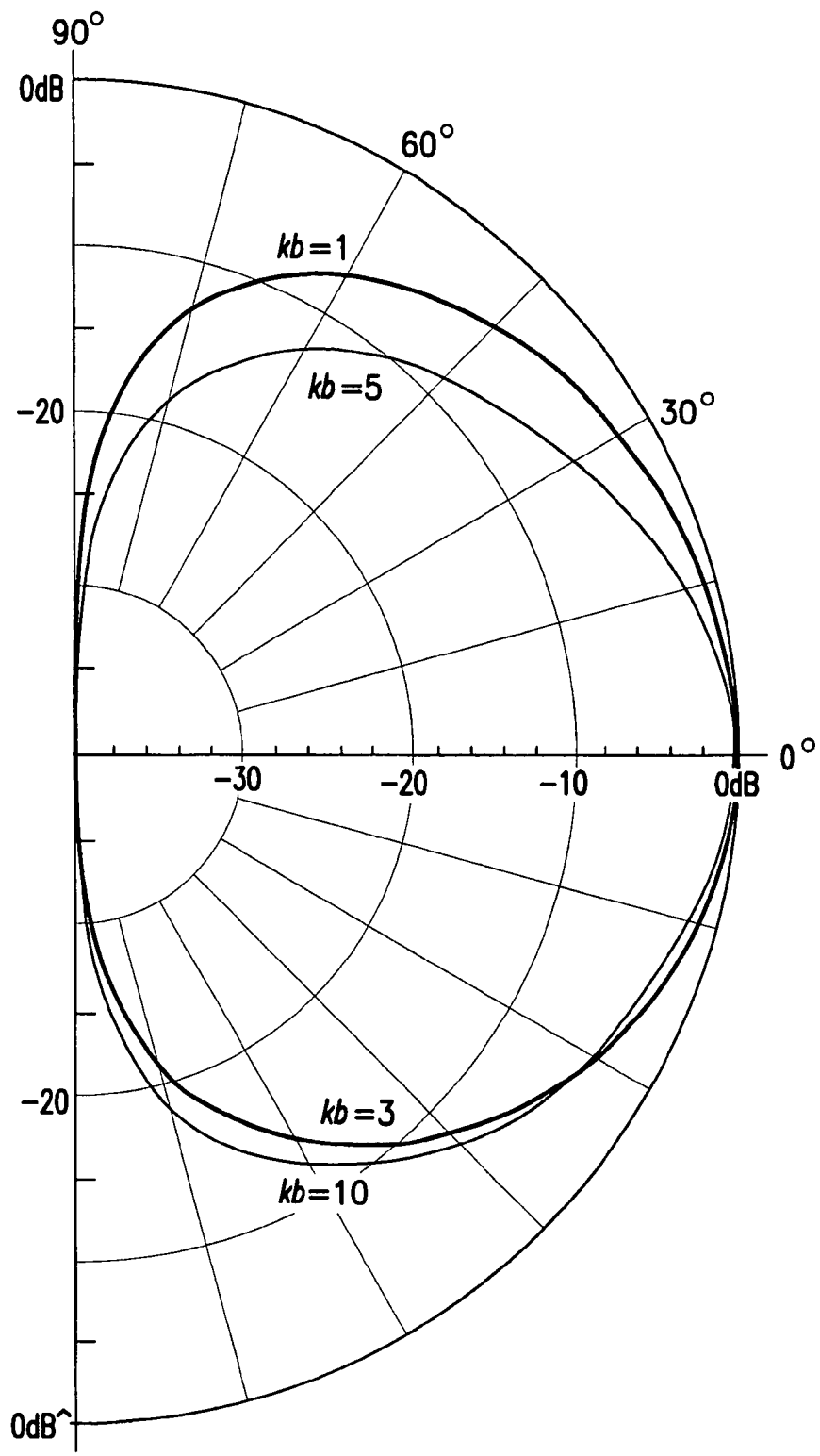
FIG. 15 depicts the normalized far-field directivity pattern of a virtual oscillating sphere using a planar source with uniform surface pressure magnitude but variable delay.

The on-axis response and directivity patterns plotted from Eqs. (49) and (48) are shown in FIGS. 14 and 15, respectively. The near field pressure is given by Eq. (4) using the Green's function of Eq. (5) and surface pressure distribution of Eq. (46). The surface velocity of the delayed pressure source is calculated by inserting the delay from Eq. (46) into Eq. (81) from T. J. Mellow, "On the sound field of a resilient disk in free space," J. Acoust. Soc. Am. 123(4), 1880-1891 (2008), for the near pressure field resilient disk in free space. Letting $r_1 = \sqrt{z^2 + w_0^2}$, $r_a = \sqrt{z^2 + b^2}$, and $\cos \beta = z/r_1$ gives $$\tilde{p}(w, z) = \frac{ik\tilde{p}_0}{\sqrt{\pi}} \sum_{n=0}^{\infty} (-1)^n (4n+3) \frac{\Gamma\left(n+\frac{3}{2}\right)}{\Gamma(p+1)} \times \frac{j_{2n+1}(kw)}{w} \quad (50)$$

$$\int_0^b h_{2n+1}^{(2)}\left(k\sqrt{z^2+w_0^2}\right) P_{2n+1}\left(\frac{z}{\sqrt{z^2+w_0^2}}\right) w_0 dw_0,$$

From this the surface velocity is given by $$\tilde{u}(w) = \frac{1}{-ik\rho c} \frac{\partial}{\partial z} \tilde{p}(w, z)|_{z\to 0}, \; 0 \le w \le b, \quad (51)$$

Figure 16:
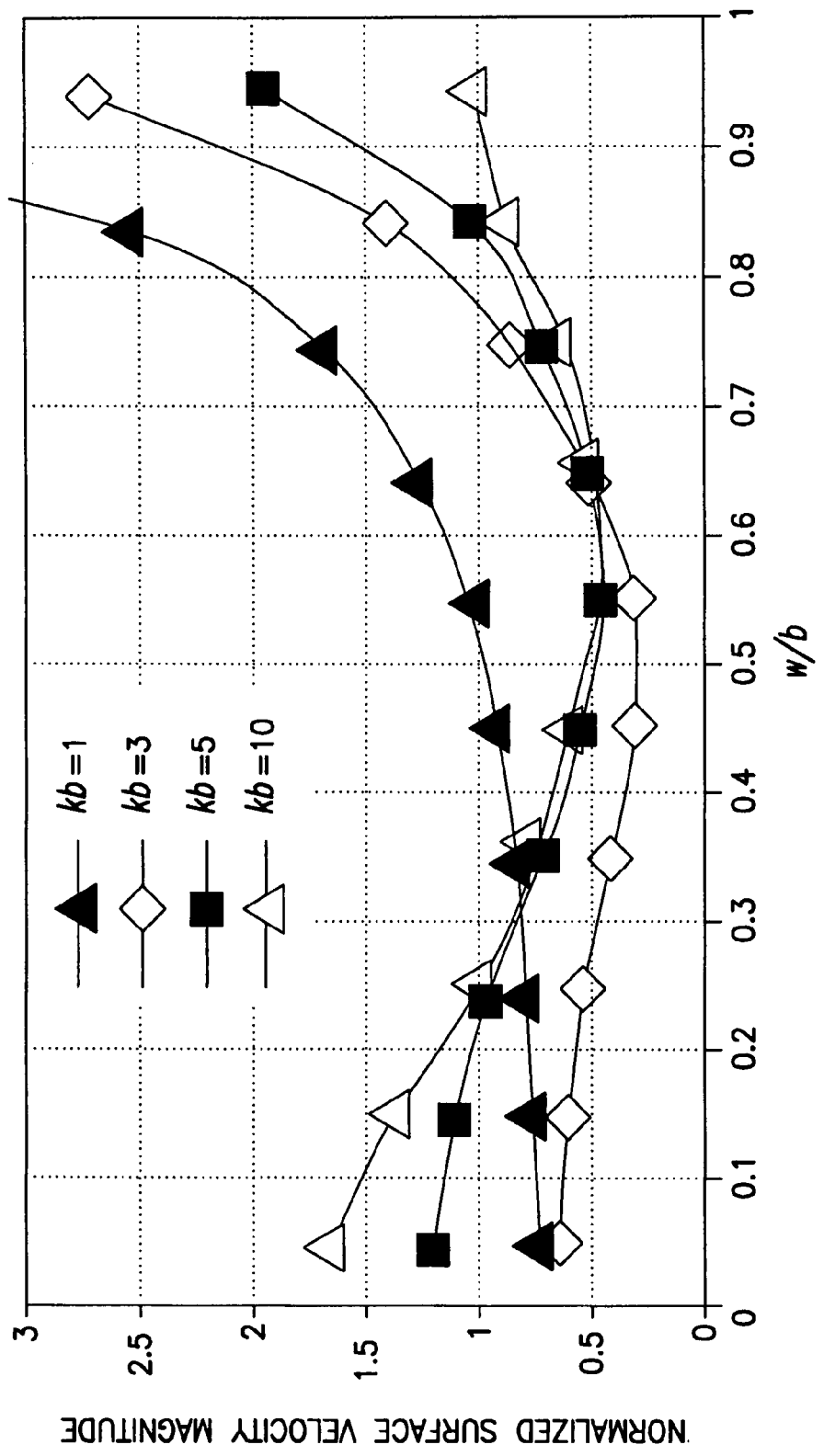
FIG. 16 shows the normalized surface velocity magnitude of the planar source with uniform surface pressure magnitude but variable delay.
Figure 17:
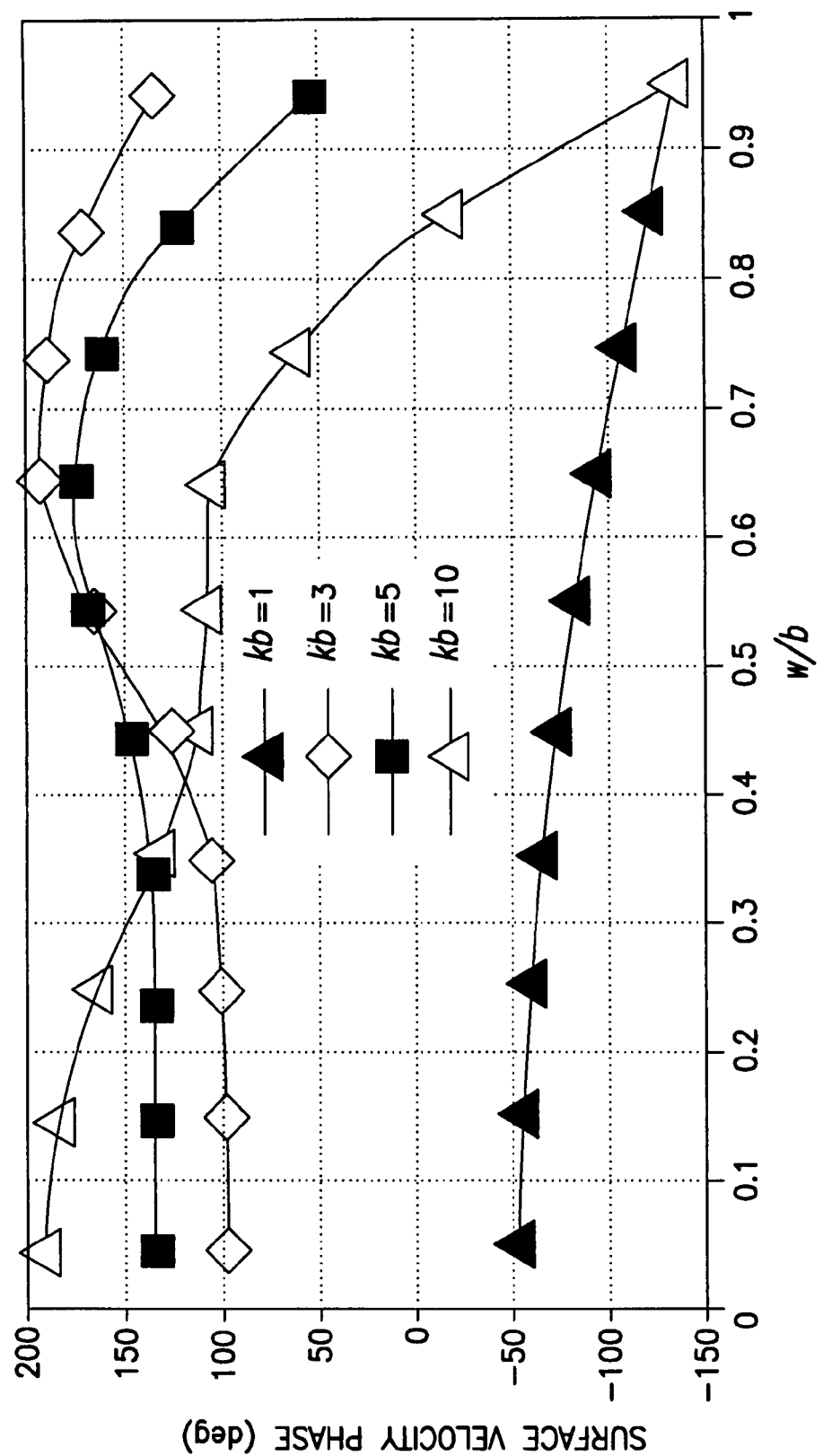
FIG. 17 shows the normalized surface velocity phase of the planar source with uniform surface pressure magnitude but variable delay.

The normalized magnitude and phase of the surface velocity is plotted in FIGS. 16 and 17, respectively.

Virtual Oscillating Sphere Using a Planar Array of Concentric Ring Radiators

As an application for the solutions it is shown here how an array of concentric radiators can be optimized to provide an even sound field. First assume that the radiator in question is a plane with a center element and a number of surrounding rings as shown in FIG. 2. The standard technique to solve the directivity problem in plane radiators would be to make the radiating surface long in the vertical and narrow in horizontal direction. However, this will not help if the device with the loudspeaker is portable, and one cannot predict before hand how the user is going to hold it. Thus, a circular solution is better—in particular as an upwards radiating circular speaker element is not directional at all in the horizontal direction.

The far field representation of the sound is the summation over j of each element from Eqs. (35) and (48 36):

$$\tilde{p}(r, \theta) = -ika_j^2 \rho c \frac{e^{-ikr}}{2r} \sum_{j=1}^{J} \tilde{u}(a_j) D_j(\theta), \quad (52)$$

where the directivity functions D(θ) are given by even functions $$D_j(\theta) = kb\cos\theta \sum_{n=0}^{N} A_{ni} \Gamma\left(n+\frac{5}{2}\right) \left(\frac{2}{kb\sin\theta}\right)^{n+\frac{3}{2}} J_{n+\frac{3}{2}}(kb\sin\theta). \quad (53)$$

and the complex velocity for each ring $\tilde{u}(a_j)$ is obtained from Eq. (51).

In view of the foregoing discussion it can be noted that the dipole point source in a circular baffle is the limiting case of a disk in a circular baffle where the radius of the disk is infinitesimally small. Unlike a circular disk of finite radius, the peaks in the response of the baffled dipole point source (see FIG. 10) show no sign of diminishing with increasing frequency. In the case of a circular disk where the baffle radius is eight times that of the disk, the shape of the first maximum is virtually identical to that of the baffled dipole point source. However, the remaining maxima are progressively diminished due to the fact that the disk becomes more directional at high frequencies.

It is interesting to compare the on-axis response of the baffled dipole point source with that of a dipole point source in free space (see FIG. 10), which is a classic comb filter. Although their minima are perfectly aligned, the maxima of the baffled point source are a few dBs higher due to reflections at the rim of the baffle giving rise to radial resonance modes. The low frequency radiation from the baffled point source is weaker than that of the dipole in free space due to a stronger anti-phase rear-wave emerging at the rim which has spread out hemispherically from the center. This is in contrast to the dipole in free space where the anti-phase radiation from the furthest point source spreads out spherically.

Similar differences as those just described can be seen between the two monopole responses shown in FIG. 11. The overall shift of 6 dB in the output between low frequencies and high frequencies can be explained by the fact that when the wavelength is much greater than the radius of the baffle, the monopole point source effectively radiates into whole space, but when the wavelength is short, the source behaves more or less as though the baffle is infinite and thus radiates mainly into half space.

Because the oscillating sphere is an axial velocity source, one might expect a planar velocity source with a uniform velocity magnitude but the phase delay path length of that shown in FIG. 6 to give a good approximation. Although the directivity pattern of FIG. 13 is reasonably good, the on-axis response of FIG. 12 is rather irregular. Better results are obtained using a pressure source which gives the smooth on-axis response of FIG. 14 and an almost constant directivity pattern that is free of ripples or side lobes, as shown in FIG. 15, which is perhaps slightly surprising because, unlike the oscillating sphere, the surface velocity magnitude shown in FIG. 16 increases towards the rim. This kind of result should be achievable using an electrostatic or electret transducer for high quality reproduction of the electrical signal where the stator electrodes are divided into concentric rings as shown in FIG. 2.

Figure 10:
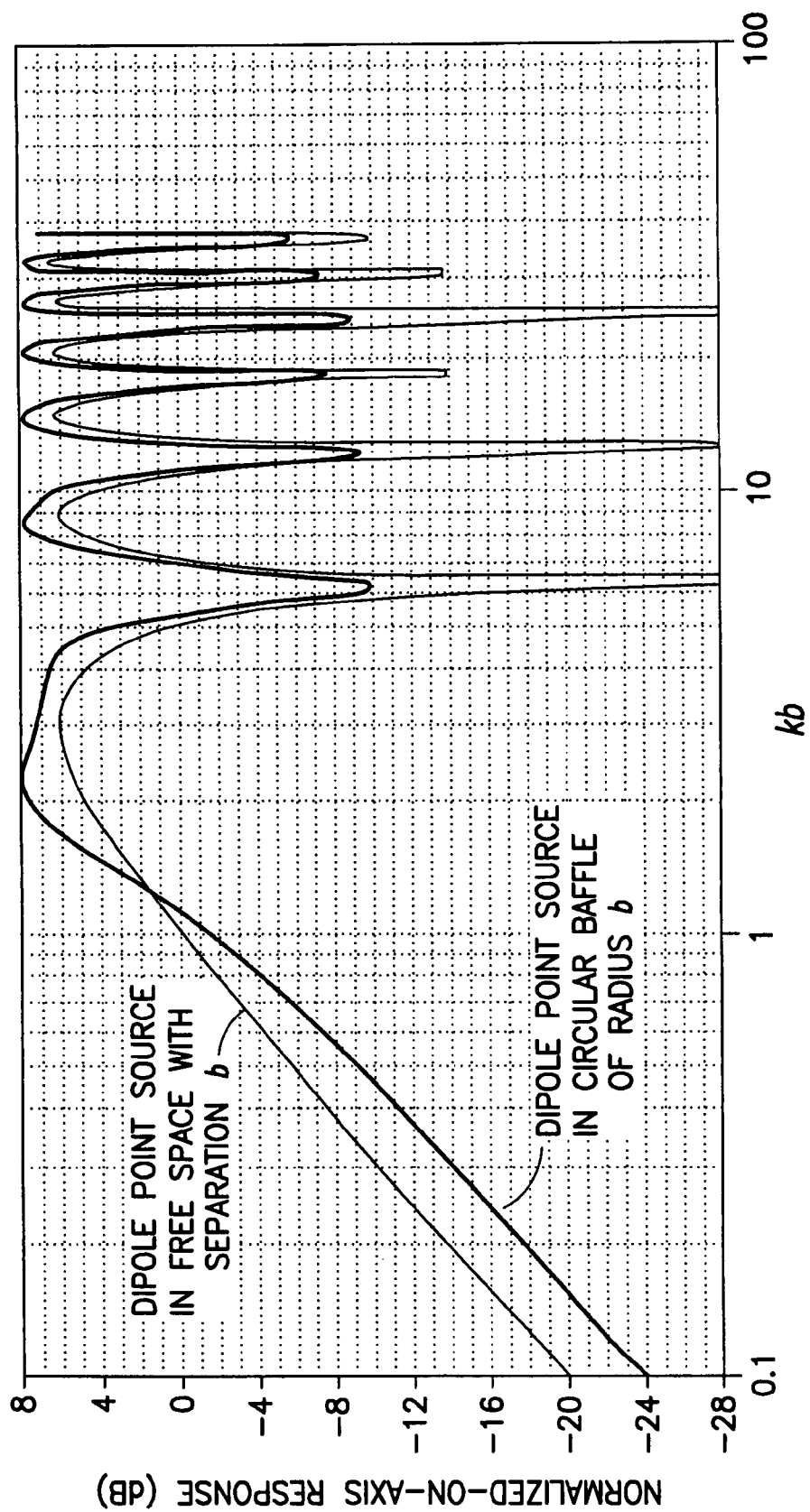
FIG. 10 illustrates the normalized far-field on-axis response of a dipole point source in a circular open baffle with constant volume acceleration.

An electrostatic or electret loudspeaker is virtually a pure pressure source except that the rim of the membrane is normally clamped, whereas the idealized model used here is freely suspended which produces a singularity at the rim. If a velocity transducer is used, such as an array of electrodynamic loudspeakers, then acceptable results are obtained when the velocity distribution is arranged to be the same as that of a pressure transducer. The directivity response of nine concentric rings with a central disk is shown in FIG. 2. Discretization aside, this should be considered as an approximation to the result because a velocity source has a different radiation impedance from a pressure source. In the case of a pressure source, the diaphragm is acoustically transparent to the surrounding acoustic field whereas that of a velocity source is completely opaque. The point source in a circular baffle, for which the on-axis response is shown in FIG. 10, may be considered as the central element of the array. Clearly a smoother response is obtained when the baffle is transparent. It can be noted that the on-axis response of FIG. 14 is also obtained from a planar source in an infinite baffle with a uniform velocity magnitude but with the phase delay path length of that shown in FIG. 6, where the driving velocity is constant at all frequencies.

A relatively straightforward analytical solution for the pressure field of annular dipole rings within a finite baffle has been provided above. In practice, this is important in future portable devices, where one cannot easily deploy multiple speaker configurations, nor close the back side to a large back cavity. However, large displays will provide larger, although thin, areas to work within, and which are suitable for dipole electrostatic or electret speakers.

Figure 18:
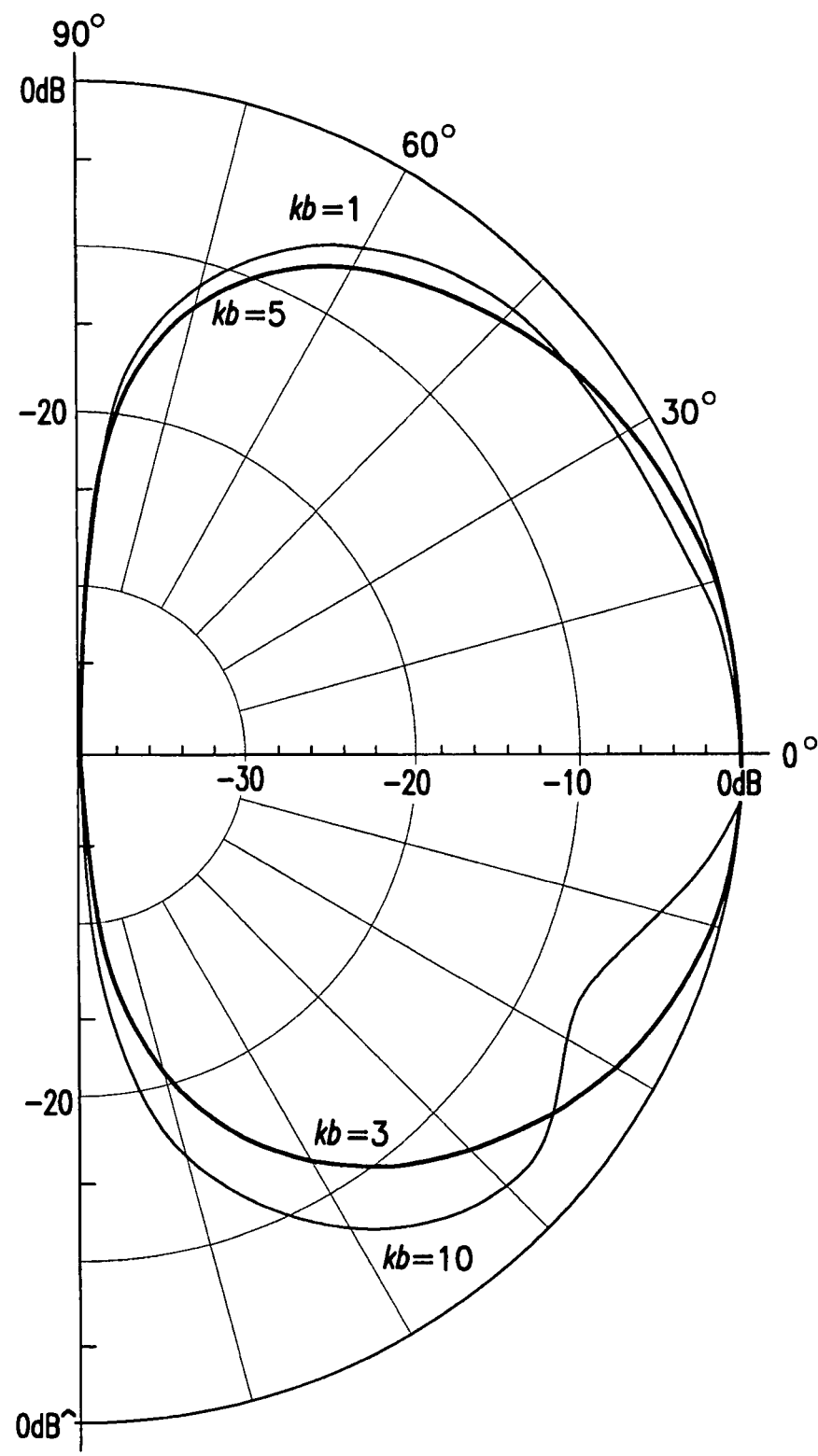
FIG. 18 shows the normalized far-field directivity pattern with optimized velocities for ten planar rings.

A challenge has been how optimally to control the directivity of a large planar source. Here the analytical solution has been used to specify an axially symmetric segmentation of the planar radiator, with each ring with its own frequency dependent velocity magnitude and phase, which gives a good radiation pattern across a wide range of frequencies as seen in FIG. 18.

The radiation impedances of the rings in a finite baffle have also been provided in order to complete the system model. Although this discussion describes the blueprint for a balanced, almost ideal, planar radiating speaker, the realization of a manufacturable design may deviate in some respects from the ideal model.

In the foregoing description the emphasis has been placed primarily on a dipole loudspeaker arrangement for directionality. However, it should be noted that monopole loudspeaker embodiments can also be realized in accordance with the exemplary embodiments of this invention. In this case there is provided a substantially sealed rear acoustic cavity or cavities. Note that by the use of a thermoacoustic speaker composed of carbon nanotubes (CNT) (e.g., see M. Berger, "Nanotechnology that will rock you" Nanowerk LLC, (2008)) one could produce the same effect. Thus, it should be appreciated that the exemplary embodiments are applicable as well to, and can provide the weights for, a monopole loudspeaker implementation, using similar constant pressure criteria.

Note also that for the dipole arrangement the angle of directionality can be steered automatically using, for example, a digital signal processor (DSP) or some other type of control device or mechanism.

For example, assume the case of a device or system that lies on a table and that has axial symmetry. In this case the device can radiate evenly to the horizontal plane. It thus becomes possible to steer the beam to lower angles, as beaming it to the ceiling may not be advantageous. This would apply to, for example, a teleconferencing situation where multiple participants have placed their mobile phones on the table to make a combined effort for higher volume. The ability to use the DSP to run the system from one mode (as much of a dipole) to the other (beam to low, axially symmetric, angles) would thus be beneficial. In this case the DSP can calculate or otherwise derive the proper weights to correctly steer the acoustic output.

Additional DSP algorithms can further optimize playback characteristics. For example, the DSP may serve as an equaliser, a dynamic range controller, a gain controller, a noise suppressor, a transducer protection circuit including a displacement and thermal controller, etc.

The exemplary embodiments thus also provide a system and a method thereof capable of changing the weights to obtain an alternate directivity pattern or patterns. Note that while the angle is not steerable left to right in this implementation without breaking the axial symmetry. However, including "rocking"-type of motions are possible, and similar considerations can be utilized to make beam steering (as in a microphone array) that is as independent as possible of frequency. This is facilitated by the use of the exemplary embodiments, which provide an analytical solution and design principle that yields smooth, nearly frequency independent directivity patterns.

Note that the system is also usable for microphone arrays as well by applying the gains and time delays to ring types of microphone surfaces.

As one non-limiting example of the construction of the loudspeaker 5, a gap between the membrane 8 and electrodes 6 can be in the range of about 0.3 mm to about 3 mm. The membrane material may be, for example, metalized kapton or mylar, or any suitable strong flexible film with a thickness in a range of about 5 micrometers to about 20 micrometers. The conductive coating may have a thickness of less than about 100 nm. The number of rings 6 depends on the size of the loudspeaker 5 which could vary from a width of about 5 cm (or smaller) to about 50 cm (or larger) depending on the application (e.g., from a PDA to a home entertainment system). Preferably they should be narrow as compared with the wavelength of the highest frequency in order to avoid spatial aliasing. One exemplary ring width is about 1 cm. The rings 6 can be plated onto insulating stators through which there would be an array of holes which are optimized to provide enough viscous flow resistance to damp the vibration modes of the membrane 8. The supply voltage of the amplifiers shown in the exemplary embodiment of FIG. 1 could be in the range of about 1200V-6000 V, but the current would only be in the range of about 0.1-10 mA at 1 kHz, depending on size. The delay of the outer ring 6 relative to the central element could vary from about 70 microseconds to about 700 microseconds, again depending on size.

It should be pointed out that the electrodes need not necessarily be divided into rings per se. Alternatively, for example, a matrix array of electrode elements can be configured to radiate as rings according to this invention, or to produce any other directivity pattern such as, but not limited to, a steered beam.

Based on the foregoing it should be apparent that the exemplary embodiments of this invention provide a method, apparatus and computer program(s) to provide speaks which maintain uniform pressure over the entire surface of the speaker.

Figure 19:
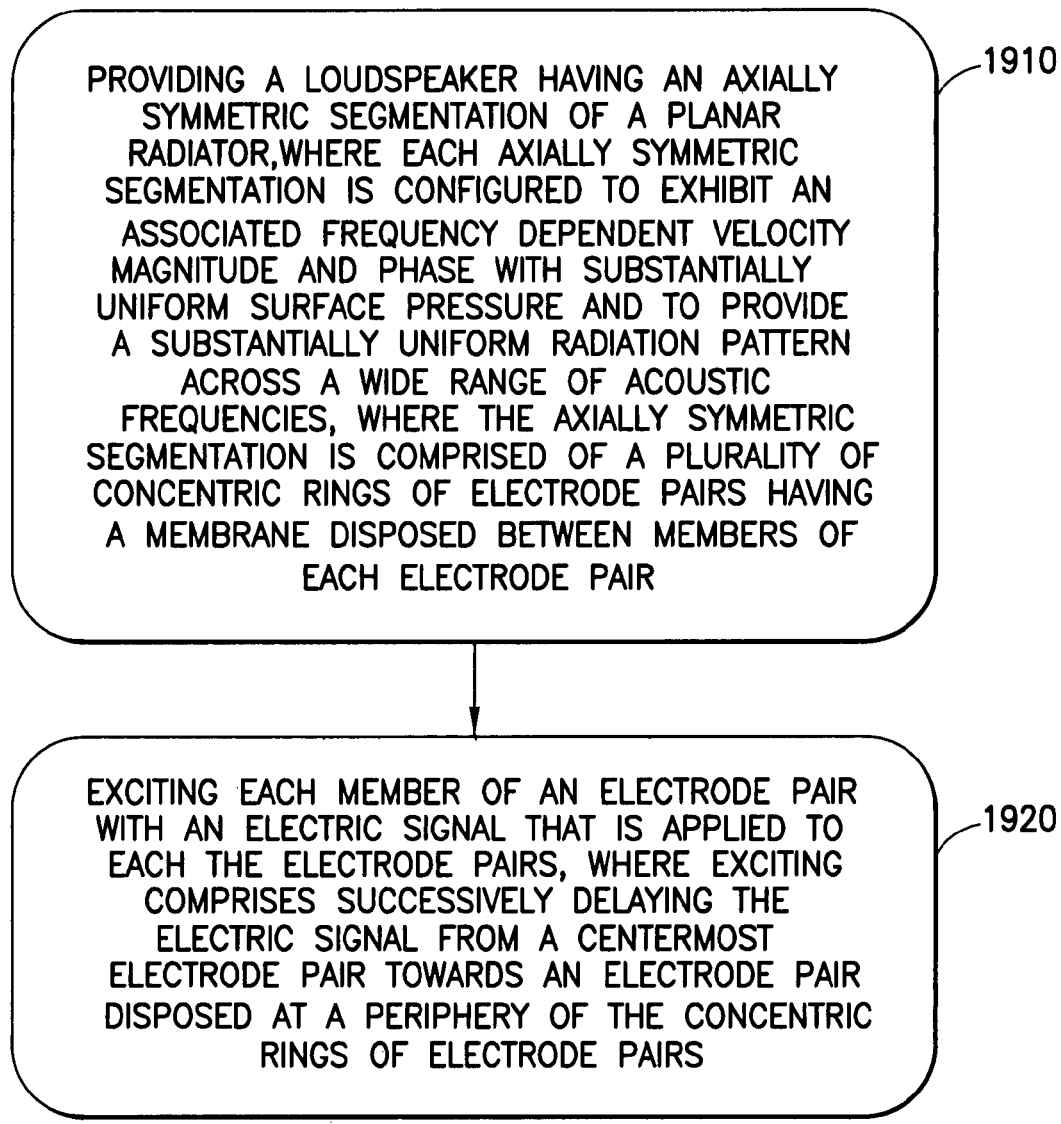
FIG. 19 is a logic flow diagram that illustrates the operation of an exemplary method, and a result of execution of computer program instructions embodied on a computer readable memory, in accordance with various exemplary embodiments of this invention.

FIG. 19 is a logic flow diagram that illustrates the operation of a method, and a result of execution of computer program instructions, in accordance with the exemplary embodiments of this invention. In accordance with these exemplary embodiments a method performs, at Block 1910, a step of providing a loudspeaker having an axially symmetric segmentation of a planar radiator is performed. Each axially symmetric segmentation is configured to exhibit an associated frequency dependent velocity magnitude and phase with substantially uniform surface pressure and to provide a substantially uniform radiation pattern across a wide range of acoustic frequencies. The axially symmetric segmentation is comprised of a plurality of concentric rings of electrode pairs having a membrane disposed between members of each electrode pair. The method also includes, at Block 1920, a step of exciting each member of an electrode pair with an electric signal that is applied to each the electrode pairs. Exciting comprises successively delaying the electric signal from a centermost electrode pair towards an electrode pair disposed at a periphery of the concentric rings of electrode pairs.

The various blocks shown in FIG. 19 may be viewed as method steps, and/or as operations that result from operation of computer program code, and/or as a plurality of coupled logic circuit elements constructed to carry out the associated function(s).

Based on the foregoing it should be apparent that the exemplary embodiments of this invention provide a dipole loudspeaker that comprises an axially symmetric segmentation of a planar radiator, where each axially symmetric segmentation has an associated frequency dependent velocity magnitude and phase but with substantially uniform surface pressure in order to provide a substantially uniform radiation pattern across a wide range of acoustic frequencies.

The loudspeaker as in the preceding paragraph, where the axially symmetric segmentation is comprised of a plurality of concentric rings of electrode pairs having a membrane disposed between members of each electrode pair, where each member of an electrode pair is driven by a respective bridge amplifier having anti-phase outputs, and where an input electric signal is amplified by a first bridge amplifier and applied to a centermost electrode pair, and where each successive bridge amplifier is coupled to an output of a phase delay element of a plurality of serially connected phase delay elements such that the input electric signal is successively delayed from the centermost electrode pair towards an electrode pair disposed at a periphery of the concentric rings of electrode pairs.

The loudspeaker as in the preceding paragraph, where the plurality of bridge amplifiers and phase delay elements are embodied in at least one integrated circuit chip or module.

The loudspeaker as in the preceding paragraph, where the rings are one of circular, or elliptical, or rectangular, or square in shape.

The loudspeaker as in the preceding paragraphs, embodied as one of an electret, or an electrostatic, or an electrodynamic, or a piezoelectric loudspeaker.

The loudspeaker as in the preceding paragraph, where for the case of an electret loudspeaker the membrane contains a polarizing charge, and where for the case of the electrostatic loudspeaker the membrane comprises a conductive coating connected to a voltage.

The loudspeaker as in the preceding paragraphs, embodied in a portable user device such as a communications device, or a computing device, or a gaming device, or a music playback device.

Based on the foregoing it should be further apparent that the exemplary embodiments of this invention provide a loudspeaker that comprises an axially symmetric segmentation of a planar radiator, where each axially symmetric segmentation has an associated frequency dependent velocity magnitude and phase but with substantially uniform surface pressure in order to provide a substantially uniform radiation pattern across a wide range of acoustic frequencies, where the axially symmetric segmentation is comprised of a plurality of concentric rings of electrode pairs having a membrane disposed between members of each electrode pair, where there is at least one amplifier for driving each member of an electrode pair, and where there are a plurality of phase delay elements such that an electric signal applied to each the electrode pairs is successively delayed from the centermost electrode pair towards an electrode pair disposed at a periphery of the concentric rings of electrode pairs.

The loudspeaker as in the preceding paragraph, comprised of a dipole loudspeaker or a monopole loudspeaker.

The loudspeaker as in the preceding paragraphs, where there is a multi-way cross-over network comprising the plurality of phase delay elements connected between an output of the amplifier and the concentric rings of electrode pairs.

The loudspeaker as in the preceding paragraphs, where the rings are one of circular, or elliptical, or rectangular, or square in shape.

The loudspeaker as in the preceding paragraphs, embodied as one of an electret, or an electrostatic, or an electrodynamic, or a piezoelectric loudspeaker.

The loudspeaker as in the preceding paragraph, where for the case of an electret loudspeaker the membrane contains a polarizing charge, and where for the case of the electrostatic loudspeaker the membrane comprises a conductive coating connected to a voltage.

The loudspeaker as in the preceding paragraphs, embodied in a portable user device such as a communications device, or a computing device, or a gaming device, or a music playback device.

Based on the foregoing it should also be apparent that the exemplary embodiments of this invention encompass a method that comprises providing a loudspeaker having an axially symmetric segmentation of a planar radiator, where each axially symmetric segmentation is capable of exhibiting an associated frequency dependent velocity magnitude and phase but with substantially uniform surface pressure in order to provide a substantially uniform radiation pattern across a wide range of acoustic frequencies, where the axially symmetric segmentation is comprised of a plurality of concentric rings of electrode pairs having a membrane disposed between members of each electrode pair; and the method further comprising exciting each member of an electrode pair with an electric signal that is applied to each the electrode pairs, where exciting comprises successively delaying the electric signal from a centermost electrode pair towards an electrode pair disposed at a periphery of the concentric rings of electrode pairs.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto.

While various aspects of the exemplary embodiments of this invention may be illustrated and described as block diagrams and circuit diagrams, or using some other pictorial representation, it is well understood that the illustrated blocks, apparatus, systems, techniques or methods described herein may be implemented in, as non-limiting examples, hardware, software, firmware, special purpose circuits or logic, general purpose hardware or controller or other computing devices, or some combination thereof.

It should thus be appreciated that at least some aspects of the exemplary embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one or more of a data processor or data processors, a digital signal processor or processors, baseband circuitry, audio circuitry and radio frequency circuitry that are configurable so as to operate in accordance with the exemplary embodiments of this invention.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

In addition, the various mathematical equations and expressions discussed above should not be construed as being limiting in any respect to the exemplary embodiments of this invention, as the general and specific principles of operation of the exemplary embodiments may be expressed in different forms and in different mathematical notations and equations.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. An apparatus comprising:
   a plurality of segmentations of a planar radiator,
   wherein each segmentation of the plurality of segmentations has an associated frequency dependent velocity magnitude and phase with substantially uniform surface pressure and provides a substantially uniform radiation pattern across a range of acoustic frequencies, and wherein the plurality of segmentations comprise:
   a plurality of axially symmetric concentric rings of electrode pairs having a membrane disposed between members of each electrode pair, each member of electrode pairs being driven by a respective bridge amplifier having anti-phase outputs.

2. The apparatus of claim 1, wherein an input electric signal is amplified by a first bridge amplifier and applied to a centermost electrode pair, and wherein each successive bridge amplifier is coupled to an output of a phase delay element of a plurality of serially connected phase delay elements, such that the input electric signal is delayed from the centermost electrode pair towards an electrode pair disposed at a periphery of the concentric rings of electrode pairs.

3. The apparatus of claim 1, wherein the plurality of bridge amplifiers and phase delay elements are embodied in at least one integrated circuit chip or module.

4. The apparatus of claim 1, embodied as an electret loudspeaker, wherein the membrane contains a polarizing charge.

5. The apparatus of claim 1, embodied as an electrostatic loudspeaker, wherein the membrane comprises a conductive coating connected to a voltage source.

6. The apparatus of claim 1, wherein the apparatus is embodied in a dipole loudspeaker.

7. The apparatus of claim 1, wherein the segmentations are one of: striped, circular, elliptical, rectangular and square in shape.

8. The apparatus of claim 1, embodied as one of: an electret, an electrostatic, an electrodynamic and a piezoelectric loudspeaker.

9. The apparatus of claim 1, wherein the plurality of segmentations comprise at least three segmentations and the width of each of the at least three segmentations is less than a wavelength of the acoustic frequencies.

10. The apparatus of claim 1, wherein the acoustic frequencies are within a frequency range of 150 Hz to 20 kHz.

11. An apparatus comprising:
    a plurality of segmentations of a planar radiator,
    wherein each segmentation of the plurality of segmentations has an associated frequency dependent velocity magnitude and phase with substantially uniform surface pressure and provides a substantially uniform radiation pattern across a range of acoustic frequencies,
    wherein the plurality of segmentations comprise a plurality of concentric rings of electrode pairs having a membrane disposed between members of each electrode pair, and
    further comprising at least one amplifier configured to drive each member of an electrode pair, and a plurality of phase delay elements,
    wherein an electric signal applied to each of the electrode pairs is delayed from the centermost electrode pair towards an electrode pair disposed at a periphery of the concentric rings of electrode pairs.

12. The apparatus of claim 11, wherein there is a multi-way cross-over network comprising the plurality of phase delay elements connected between an output of an amplifier and the concentric rings of electrode pairs.

13. The apparatus of claim 11, wherein the rings are one of circular, or elliptical, or rectangular, or square in shape.

14. The apparatus of claim 11, embodied as an electret loudspeaker, wherein the membrane contains a polarizing charge.

15. The apparatus of claim 11, embodied as an electrostatic loudspeaker, wherein the membrane comprises a conductive coating connected to a voltage source.

16. The apparatus of claim 11, embodied in one of: a dipole loudspeaker and a monopole loudspeaker.

17. The apparatus of claim 11, embodied as one of: an electret, an electrostatic, an electrodynamic and a piezoelectric loudspeaker.

18. A method comprising:
    providing a loudspeaker having an segmentation of a planar radiator,
    wherein each segmentation is configured to exhibit an associated frequency dependent velocity magnitude and phase with substantially uniform surface pressure and to provide a substantially uniform radiation pattern across a range of acoustic frequencies,
    wherein the segmentation is comprised of a plurality of concentric rings of electrode pairs having a membrane disposed between members of each electrode pair; and
    exciting each member of an electrode pair with an electric signal that is applied to each the electrode pairs,
    wherein exciting comprises delaying the electric signal from a centermost electrode pair towards an electrode pair disposed at a periphery of the concentric rings of electrode pairs.

19. The method of claim 18, wherein the rings are one of circular, or elliptical, or rectangular, or square in shape.

* * * * *